(12) United States Patent
Gyoutoku et al.

(10) Patent No.: US 7,158,161 B2
(45) Date of Patent: Jan. 2, 2007

(54) ORGANIC ELECTROLUMINESCENCE ELEMENT AND AN EXPOSURE UNIT AND IMAGE-FORMING APPARATUS BOTH USING THE ELEMENT

(75) Inventors: Akira Gyoutoku, Saga (JP); Takafumi Hamano, Fukuoka (JP); Yuji Toyomura, Fukuoka (JP); Tetsuro Nakamura, Hyogo (JP); Kenichi Masumoto, Oosaka (JP); Shinya Yamamoto, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 332 days.

(21) Appl. No.: 10/665,011

(22) Filed: Sep. 22, 2003

(65) Prior Publication Data

US 2005/0248267 A1    Nov. 10, 2005

(30) Foreign Application Priority Data

Sep. 20, 2002 (JP) ............... P.2002-274534
Jul. 9, 2003   (JP) ............... P.2003-194211
Sep. 12, 2003 (JP) ............... P. 2003-321368

(51) Int. Cl.
  *B41J 2/385* (2006.01)
  *B41J 2/45* (2006.01)

(52) U.S. Cl. ...................... 347/130; 347/238
(58) Field of Classification Search ........... 347/122, 347/130, 224, 238, 244, 258; 313/498–506; 428/411.1
See application file for complete search history.

(56) References Cited

U.S. PATENT DOCUMENTS 5,792,557 A * 8/1998 Nakaya et al. ........... 428/411.1
5,917,280 A    6/1999 Burrows et al.
5,932,895 A    8/1999 Shen et al.
6,107,734 A    8/2000 Tanaka et al.
6,239,453 B1   5/2001 Yamada et al.
6,274,980 B1   8/2001 Burrows et al.
6,337,492 B1   1/2002 Jones et al.
6,420,031 B1   7/2002 Parthasarathy et al.
6,469,437 B1  10/2002 Parthasarathy et al.
6,472,817 B1  10/2002 Kawase
6,566,806 B1   5/2003 Kawai
6,798,440 B1 *  9/2004 Yasuda ..................... 347/244
2002/0176992 A1 11/2002 Parthasarathy et al.
2003/0189401 A1* 10/2003 Kido et al. ................ 313/504
2004/0027059 A1*  2/2004 Tsutsui ..................... 313/504
2004/0161192 A1   8/2004 Hamano et al.

(Continued)

FOREIGN PATENT DOCUMENTS

DE          10026236        3/2001

(Continued)

OTHER PUBLICATIONS

C.W. Tang et al., "Organic Electroluminescent Diodes", Appl. Phys. Letts., vol. 51, No. 12, pp. 913-915 (1987).

(Continued)

*Primary Examiner*—Hai Pham
(74) *Attorney, Agent, or Firm*—Greenblum & Bernstein, P.L.C.

(57) ABSTRACT

Providing an exposure unit using an organic electroluminescence element with a large emitted light quantity.

The organic electroluminescence element has, on a substrate 31, an anode 32 acting as a hole injection electrode, a cathode 33 acting as an electron injection electrode, a first and second emission layers 34 and 35 each having a light emission region, and a charge generation layer 38 injecting electrons into the light emission layer 34 lying close to the anode 32 and injecting holes into the light emission layer 35 lying close to the cathode 33, these layers being arranged between the anode 32 and the cathode 33.

19 Claims, 18 Drawing Sheets

U.S. PATENT DOCUMENTS

2005/0151824 A1* 7/2005 Iwamatsu et al. .......... 347/224

FOREIGN PATENT DOCUMENTS

| EP | 1098376 | 5/2001 |
| --- | --- | --- |
| JP | 11-329749 | 11/1999 |
| JP | 2003-45676 | 2/2003 |
| WO | 00/70690 | 11/2000 |
| WO | 2004/055897 | 7/2004 |

OTHER PUBLICATIONS

J. Kido et al., "High Quantum Efficiency Organic EL Devices Having Charge Generation Layer". 49th Japan Society of Applied Physics and Related Societies, Mar. 2003, p. 1308, XP008035187.

Patent Abstracts of Japan, vol. 2003, No. 06, Jun. 3, 2003 (See JP 2003 - 045676 above).

Patent Abstracts of Japan, vol. 2000, No. 02, Feb. 29, 2000 (See JP 11-329749 above).

* cited by examiner

ORGANIC ELECTROLUMINESCENCE ELEMENT AND AN EXPOSURE UNIT AND IMAGE-FORMING APPARATUS BOTH USING THE ELEMENT

BACKGROUND OF THE INVENTION

1. Field of the Invention

The present invention relates to an organic electroluminescence element used for a light emission device in various apparatuses and an exposure unit as well as an image-forming apparatus using the element.

2. Description of the Related Art

An electroluminescence element is a light emission device using electric field-induced light emission of a solid luminescent material. Now, inorganic electroluminescence elements that use inorganic materials as the light emitter are in practical use, and expansion of their applications to the backlight for liquid crystal displays or flat panel displays are intended in some segments. However, the voltage required for the light emission of inorganic electroluminescence elements is rather high, i.e., 100 v or higher. In addition, due to the difficulty in blue light emission, it is difficult to achieve full color emission based on the three primary colors of R, G and B. Moreover, since the refractive index of the material used as the light emitter of an inorganic electroluminescence element is very high, the emission light is strongly affected by the effect of the total reflection at boundaries. Accordingly, the efficiency of taking out the actually emitted light into the air is as low as roughly 10 to 20%, which value is difficult to improve.

On the other hand, studies on electroluminescence elements using organic materials have called attention for a long time. Though various investigations have been made, they never evolved to a full-scale study for practical use because the emission efficiency was extremely low.

But, in 1987, C. W. Tang et al of Kodak Co. proposed an organic electroluminescence element having a function-separated, stacked structure in which the organic material is divided into two layers, i.e., a hole transport layer and a light emission layer. And it has become evident that, in spite of a low voltage of 10 V or lower, an emission luminance as high as 1000 cd/m$^2$ or more is attained (Refer to C. W. Tang and S. A. Vanslyke; Applied Physics Letter (Appl. Phys. Lett.) (USA), Vol. 51, 1987, p. 913.). Since then, organic electroluminescence elements have attracted attention on a sudden. Still now, function separation type organic electroluminescence elements having a similar stacked structure are being actively studied. In particular, efficiency enhancement and life expansion, which are indispensable for the product development of organic electroluminescence elements, are also being thoroughly investigated, resulting in the recent development of displays using organic electroluminescence elements.

Now, the structure of a conventional, common organic electroluminescence element will be explained with reference to FIG. 21. FIG. 21 is a cross-sectional view showing the essential part of a conventional organic electroluminescence element.

As is shown in FIG. 21, the organic electroluminescence element includes an anode 52 comprising a transparent electro-conductive film such as ITO formed by sputtering or resistive heating vapor deposition on a substrate 51 made of, for example glass, a hole transport layer 53 made of, for example, N,N'-diphenyl-N,N'-bis(3-methylphenyl)-1,1'-diphenyl-4,4'-diamine (which will be abbreviated as TPD hereinafter) similarly formed by resistive heating vapor deposition on the anode 52, a light emission layer 54 made of aluminum 8-hydroxyquinoline (which will be abbreviated as Alq$_3$ hereinafter) prepared by resistive heating vapor deposition on the hole transport layer 53, and a cathode 55 made of a metallic film with a thickness of 100 to 300 nm formed by resistive heating vapor deposition on the light emission layer 54.

When a dc voltage or dc current is applied to the organic electroluminescence element having such structure by making the anode 52 a positive electrode and the cathode 55 a negative electrode, holes are injected into the light emission layer 54 from the anode 52 via the hole transport layer 53, and electrons are injected into the light emission layer 54 from the cathode 55. In the light emission layer 54, recombination of the hole and electron takes place; and when an exciton generated by such recombination shifts from the excited state to the ground state, the phenomenon of light emission takes place.

Generally speaking, in such organic electroluminescence element, the light emitted from the luminescent-material in the light emission layer 54 radiates omni-directionally from the luminescent material as the center, and emerges into the air through the hole transport layer 53, anode 52 and substrate 51. Alternatively, the light once proceeds in the direction opposite to the light emerging direction (the direction toward the substrate 51), is reflected at the cathode 55, and emerges into the air through the light emission layer 54, hole transport layer 53, anode 52 and substrate 51.

Regarding the device structure of organic electroluminescence elements, there are some descriptions set forth in U.S. Pat. No. 5,917,280 and U.S. Pat. No. 5,932,895.

In an image-forming apparatus based on electrophotographic technology, an exposure unit is provided which irradiates exposure light corresponding to image data onto a photoreceptor having been charged to a pre-determined uniform potential and records an electrostatic latent image on the photoreceptor. As the conventional exposure method for such exposure unit, those based on laser beams or LED arrays are dominant.

In the case of laser beam exposure, downsizing of the unit is quite difficult since optical parts such as a polygon mirror or lenses occupy large spaces. In the case of LED array exposure, cost reduction of the unit is difficult because the circuit board is expensive.

Now, with use of the above-described organic electroluminescence element as the light source, these problems can be solved.

However, since the light emitted from the organic electroluminescence element is diffusive, it has been impossible to achieve a sufficient level of light quantity required to form an image on a photoreceptor with the diffusive light from the conventional element.

SUMMARY OF THE INVENTION

Accordingly, the object of the invention is to provide an organic electroluminescence element capable of emitting a large light quantity and an exposure unit as well as an image-forming apparatus using the element.

To solve the above-cited object, the organic electroluminescence element of the invention comprises, provided on a substrate, an anode which acts as a hole injection electrode, a cathode which acts as an electron injection electrode, a plurality of light emission layers each having a light emission region and a charge generation layer which injects electrons into a light emission layer arranged close to the anode and holes into a light emission layer arranged close to the cathode, the light emission layers and the charge generation layer being arranged between the anode and the cathode, and is configured so that the work function of the charge generating layer is set-higher than the ionization potential of the light emission layer arranged close to the anode.

And to solve the problem, the organic electroluminescence element of the invention comprises, provided on a substrate, an anode which acts as a hole injection electrode, a cathode which acts as an electron injection electrode, a plurality of light emission layers each having a light emission region and a charge generation layer which injects electrons into a light emission layer arranged close to the anode and holes into a light emission layer arranged close to the cathode, the light emission layers and the charge generation layer being arranged between the anode and the cathode, and is configured so that the electron affinity of the charge generation layer is set lower than the electron affinity of the light emission layer arranged close to the anode, and that the ionization potential of the charge generation layer is set higher than the ionization potential of the light emission layer arranged close to the anode.

To solve the problem, the organic electroluminescence element of the invention further comprises, provided on a substrate, an anode which acts as a hole injection electrode, a cathode which acts as an electron injection electrode, a plurality of light emission layers each having a light emission region and a charge generation layer which injects electrons into a light emission layer arranged close to the anode and holes into a light emission layer arranged close to the cathode, the light emission layers and the charge generation layer being arranged between the anode and the cathode, and is configured so that the potential difference between the electron affinity of the light emission layer arranged close to the anode and the electron affinity of the charge generation layer, and the potential difference between the ionization potential of the light emission layer arranged close to the anode and the ionization potential of the charge generation layer are both set 0.6 eV or less.

To solve the problem, the exposure unit of the invention uses one of the organic electroluminescence elements described above as the light source.

To solve the problem, the exposure unit of the invention uses an organic electroluminescence element as the light source, the element comprising, provided on a substrate, an anode acting as a hole injection electrode, a cathode acting as an electron injection electrode, a plurality of light emission layers each having a light emission region and a charge generation layer injecting electrons into a light emission layer arranged close to the anode and injecting holes into a light emission layer arranged close to the cathode, the light emission layers and the charge generation layer being arranged between the anode and the cathode.

To solve the problem, the exposure unit of the invention uses an organic electro luminescence element as the light source, the element comprising a plurality of anodes acting as hole injection electrodes, a plurality of cathodes arranged alternately with the anodes and acting as electron injection electrodes and a plurality of light emission layers each having a light emission region and arranged between the anode and the cathode, and all these layers being provided on a substrate.

Since light emission takes place in a plurality of light emission layers in such apparatuses, the light quantity emitted by the organic electroluminescence element can be enhanced.

In addition, since the light quantity emitted by a light emission layer increases due to the enhancement of the efficiency of hole as well as electron injection into the light emission layer, the light quantity emitted by the organic electroluminescence element can be enhanced still further.

Since light emission takes place in a plurality of light emission layers, an effective result that the light quantity emitted by an organic electroluminescence element is enhanced is attained according to the invention.

The invention set forth in Claim 1 provides an organic electroluminescence element comprising, provided on a substrate, an anode which acts as a hole injection electrode, a cathode which acts as an electron injection electrode, a plurality of light emission layers each having a light emission region and a charge generating layer injecting electrons into a light emission layer arranged close to the anode and injecting holes into a light emission layer arranged close to the cathode, these layers being arranged between the anode and the cathode, and configured so that the work function of the charge generation layer is set higher than the ionization potential of the light emission layer arranged close to the anode. Since light emission takes place in the plural light emission layers, the invention has an effect of enabling the emission light quantity of the organic electroluminescence element to increase. Moreover, since the work function of the charge generation layer is set higher than the ionization potential of the light emission layer lying close to the cathode, the efficiency of hole injection to the light emission layer lying close to the cathode increases, leading to an increase of the light quantity emitted by the light emission layer lying close to the cathode. As a result, the invention has an effect of further enhancing the emission light quantity of the organic electroluminescence element.

The invention set forth in Claim 2 provides an organic electroluminescence element comprising, provided on a substrate, an anode which acts as a hole injection electrode, a cathode which acts as an electron injection electrode, a plurality of light emission layers each having a light emission region and a charge generating layer injecting electrons into a light emission layer arranged close to the anode and injecting holes into a light emission layer arranged close to the cathode, these layers being arranged between the anode and the cathode, and configured so that the electron affinity of the charge generation layer is set lower than the electron affinity of the light emission layer arranged close to the anode, and that the ionization potential of the charge generation layer is set higher than the ionization potential of the light emission layer arranged close to the cathode. Since light emission takes place in the plural light emission layers, the invention has an effect of enabling the emission light quantity of the organic electroluminescence element to increase. Moreover, since the electron affinity of the charge generation layer is set lower than that the light emission layer lying close to the anode, and the ionization potential of the charge generation layer higher than that of the light emission layer lying close to the cathode, the efficiencies of hole and electron injections to each light emission layer increase, leading to an increase of the light quantity emitted by these light emission layers. As a result, the invention has an effect of further enhancing the emission light quantity of the organic electroluminescence element.

The invention set forth in Claim 3 provides an organic electroluminescence element comprising, provided on a substrate, an anode which acts as a hole injection electrode, a cathode which acts as an electron injection electrode, a plurality of light emission layers each having a light emission region and a charge generating layer injecting electrons into a light emission layer arranged close to the anode and injecting holes into a light emission layer arranged close to the cathode, these layers being arranged between the anode and the cathode, and characterized by that the potential difference between the electron affinity of the light emission layer arranged close to the anode and the electron affinity of the charge generation layer, and the potential difference between the ionization potential of the light emission layer arranged close to the cathode and the ionization potential of the charge generation layer are both set 0.6 eV or less. Since light emission takes place in the plural light emission layers, the invention has an effect of enabling the emission light quantity of the organic electroluminescence element to increase. Moreover, by adopting such a configuration, the efficiencies of hole and electron injections to each light emission layer increase, leading to an increase of the light quantity emitted by these light emission layers. As a result, the invention has an effect of further enhancing the emission light quantity of the organic electroluminescence element.

The invention set forth in Claim 4 provides an organic electroluminescence element set forth in Claim 1 in which the charge generation layer at least consists of a first generation layer arranged close to the light emission layer lying close to the anode and a second generation layer arranged close to the light emission layer lying close to the cathode, and in which the first generation layer is set at a lower electron affinity compared to that of the second generation layer, and that the second generation layer is set at a higher ionization potential compared to that of the first generation layer. Since the efficiencies of hole and electron injections to each light emission layer increase, an increase of the light quantity emitted by these light emission layers results. Thus, the invention has an effect of further enhancing the emission light quantity of the organic electroluminescence element.

The invention set forth in Claim 5 provides an organic electroluminescence element in the invention set forth in Claim 4 in which the generation layer which is first fabricated is prepared by resistive heating, and has a capability of alleviating damaging during film formation.

The invention set forth in Claim 6 of the invention provides an organic electroluminescence element in the invention set forth in one of Claims 1 in which the charge generation layer is made of a dielectric material and that the relative permittivity of the charge generation layer is larger than that of the light emission layer, and has an effect of enabling the emission light quantity of the organic electroluminescence element to increase.

The invention set forth in Claim 7 provides an organic electroluminescence element in the invention set forth in one of Claims 1 configured so that the light emission layer arranged close to the anode and the light emission layer arranged close to the cathode are mutually made of the same material, and has a capability of enabling the increase of the light quantity emitted by the organic electroluminescence element.

The invention set forth in Claim 8 provides an organic electroluminescence element characterized by that it comprises an anode which acts as a hole injection electrode, a cathode which acts as an electron injection electrode, and a plurality of light emission layers formed between the anode and the cathode with an intervening buffer layer made of a wide gap semiconductor, and has a function of enabling the increase of the light quantity emitted by the organic electroluminescence element, since light emission takes place in the plural light-emission layers with the intervening buffer layer. Moreover, the invention has a capability of readily fabricating a high performance organic electroluminescence element because the composing materials can be appropriately chosen from a number of semiconductor materials including metal oxide, metal sulfide, compound semiconductor and organic semiconductor.

The invention set forth in Claim 9 provides an organic electroluminescence element in the invention set forth in Claim 8, wherein any of organic thin film layers constituted by the light emission layer or a hole transport layer or an electron transport layer which is formed on the light emission layer if necessary, and provided in contact with the charge generation layer on the substrate side is formed by a polymer material. The electroluminescence unit has the function of relieving a damage during film formation. Moreover, these organic thin film layers relieve the damage during the film formation. Therefore, it is possible to form a charge generation layer by using an optional process on a layer provided in contact with the charge generation layer on the substrate side, that is, the organic thin film layer to be a lower layer during the formation of the charge generation layer. Accordingly, the selectivity of the process for forming the charge generation layer can be increased so that a film can be formed by a simple process. Furthermore, a process for forming the charge generation layer is not limited. Consequently, the material of the charge generation layer can be properly selected from various materials. Thus, the selectivity of the material itself of the charge generation layer can also be increased.

The invention set forth in Claim 10 provides an organic electroluminescence element in the invention set forth in one of Claims 1 characterized by that all organic thin film layers constituted by the light emission layer or a hole transport layer or an electron transport layer which is provided on the light emission layer if necessary are formed by a polymer material. Further, by forming the organic thin film layer with a high polymer material, the organic thin film layer becomes stable against heat, thus leading to the achievement of an organic electroluminescence element having a high operation stability. Still further, since the generation of defects as well as pinholes at the interfaces between the layers is suppressed, the invention has the effect of achieving a highly stable organic electroluminescence element.

The invention set forth in Claim 11 provides an organic electroluminescence element in the invention set forth in one of Claims 1 characterized by that the charge generation layer comprises a high polymer-based organic film, and has the capabilities of alleviating damaging during film formation and simplifying the fabricating process since the charge generation layer can be made into the form of film by a process similar to that for the light emission layer.

The invention set forth in Claim 12 provides an organic electroluminescence element in the invention set forth in one of Claims 1 characterized by that the organic thin film layer and charge generation layer are fabricated by a wet film-forming process, and has the capability of reducing the material loss in the film formation. Further, since large-scale vacuum equipment is unnecessary due to the adoption of film formation by a wet process, the invention has the capabilities of enabling film formation with inexpensive equipment and easily expanding the area of the element. Still further, owing to the adoption of a wet film-forming process, the invention has a capability of forming a very stable organic electroluminescence element since the adhesion between the individual layers is enhanced.

The invention set forth in Claim 13 provides an organic electroluminescence element in the invention set forth in one of Claims 1 characterized by that a drying temperature of the organic thin film layer provided on a closer side to the cathode does not exceed a glass transition temperature of the organic thin film layer on a closer side to the anode. In the formation of a plurality of organic thin film layers (the light emitting layer or the hole transport layer or electron transport layer to be formed on the light emitting layer if necessary) which are present through the charge generation layer between the anode and the cathode, it is possible to form an organic thin film layer on the closer side to the cathode without damaging the organic thin film layer provided on the closer side to the anode.

The invention set forth in Claim 14 provides an exposure unit using an organic electroluminescence element in the invention set forth in one of Claims 1, and has the capability of achieving a level of light quantity required for exposure without making the unit large in size owing to the organic electroluminescence element with a large emission light quantity.

The invention set forth in Claim 15 provides an exposure unit which uses an organic electroluminescence element as the light source, the element comprising, provided on a substrate, an anode acting as a hole injection electrode, a cathode acting as an electron injection electrode, a plurality of light emission layers each having a light emission region and a charge generation layer injecting electrons into the light emission layer arranged close to the anode and injecting holes into the light emission layer arranged close to the cathode, and all these layers being arranged between the anode and the cathode. And the invention has the capability of achieving a level of light quantity required for exposure without making the unit large in size owing to the organic electroluminescence element in which light emission takes place in plural light emission layers and which thus exhibits a large emission light quantity.

The invention set forth in Claim 16 provides an exposure unit in the invention set forth in Claim 15 in which the light emission layer arranged close to the anode and the light emission layer arranged close to the cathode are made of the same material, and has the capability of enabling the enhancement of the emission light quantity of the organic electroluminescence element.

The invention set forth in Claim 17 provides an exposure unit in the invention set forth in Claim 15 in which the layer that includes the light emission layer arranged between the first fabricated electrode and the charge generation layer and that is arranged adjacent to the charge generation layer is made of a high polymer material, and has the capability of alleviating damaging during film formation.

DESCRIPTION OF THE PREFFERED EMBODIMENTS

In the following, some practical embodiments of the invention will be explained with reference to FIGS. 1 to 20.

In these figures, the same code is given to the same part, and duplicated explanations are omitted.

(First Embodiment)

Figure 1:
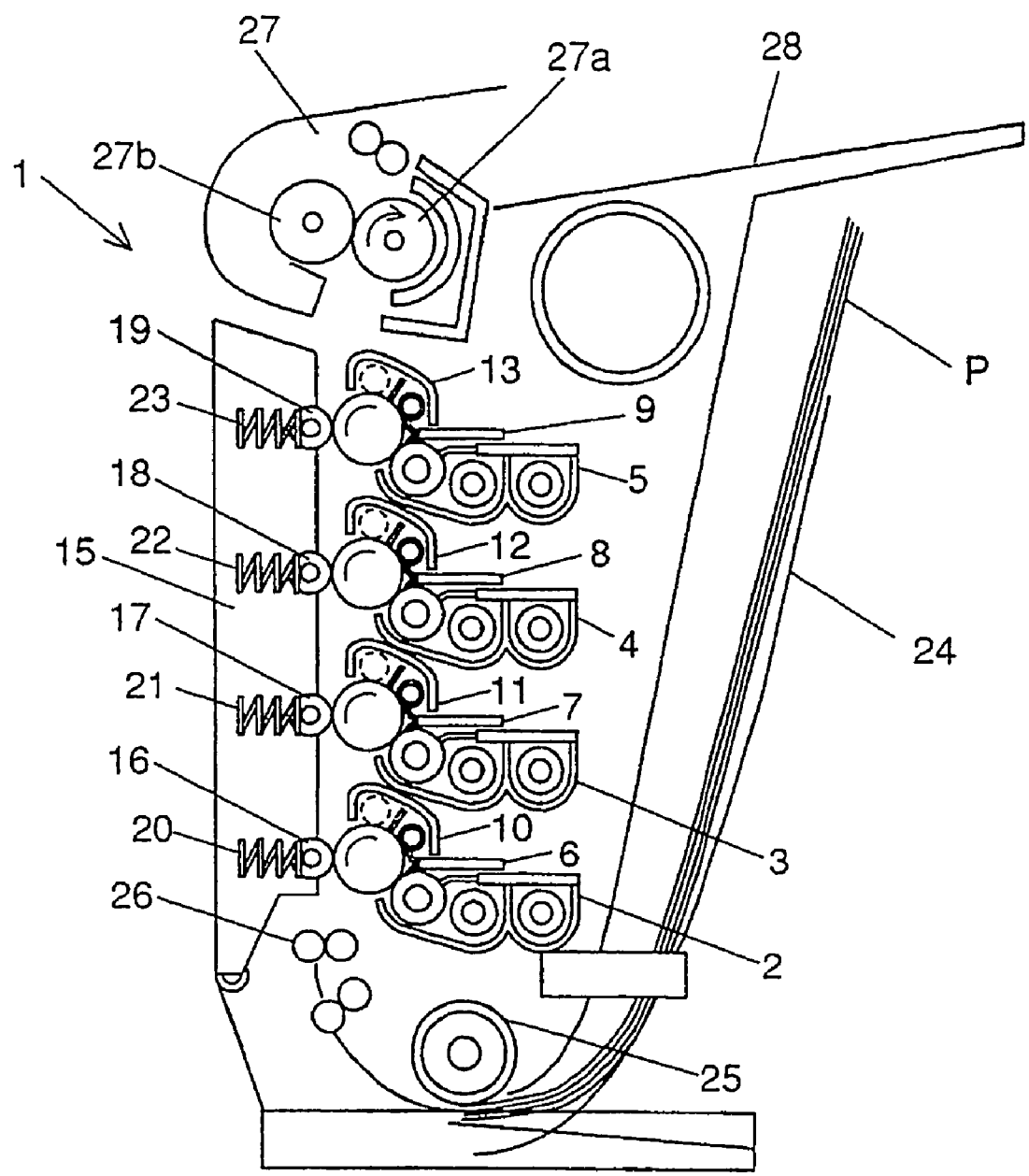
FIG. 1 is a schematic view showing the configuration of a color image-forming apparatus in the first embodiment for practicing the invention.
Figure 2:
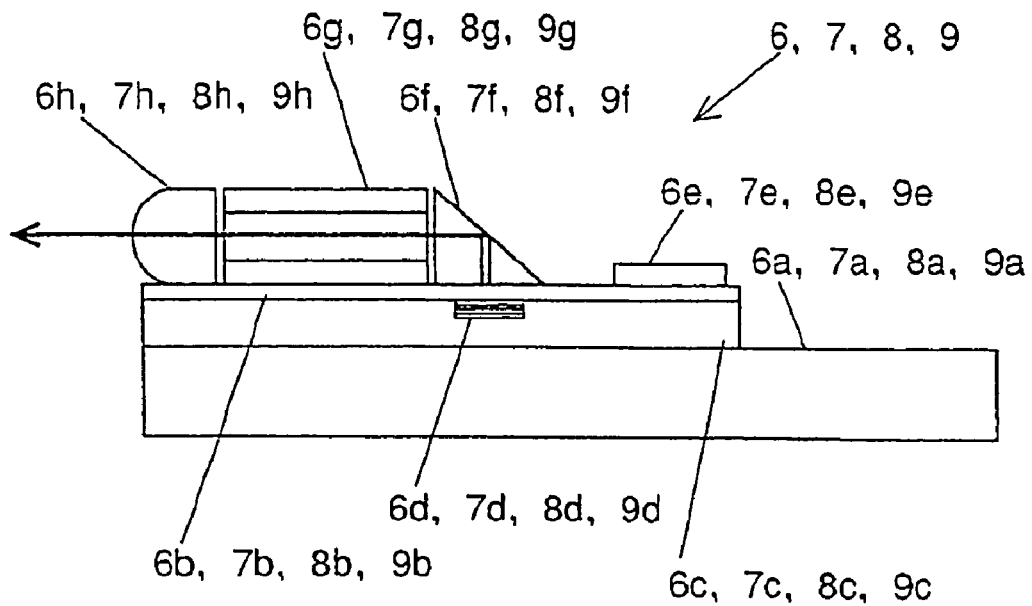
FIG. 2 is a explanatory drawing showing in detail the exposure part of the color image-forming apparatus of FIG. 1.
Figure 3:
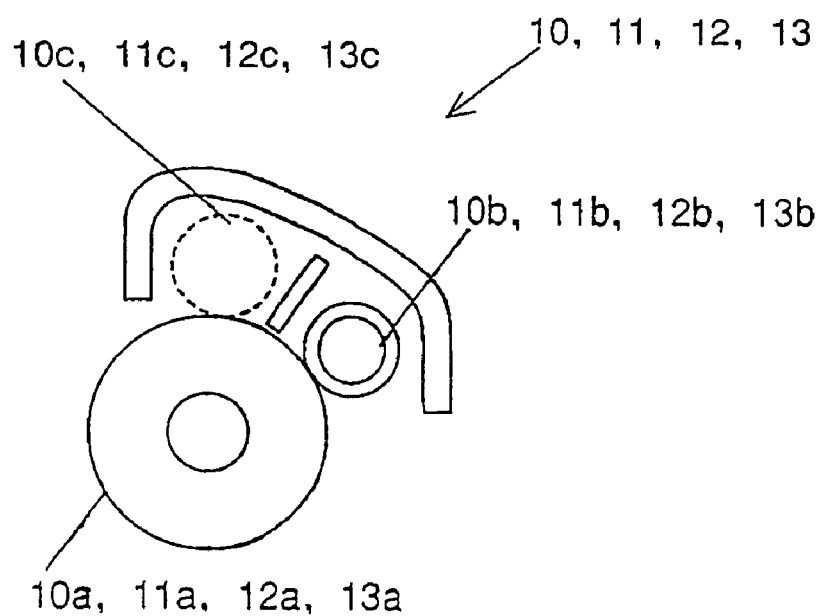
FIG. 3 is an explanatory drawing showing in detail the photoreception part of the color image-forming apparatus of FIG. 1.
Figure 4:
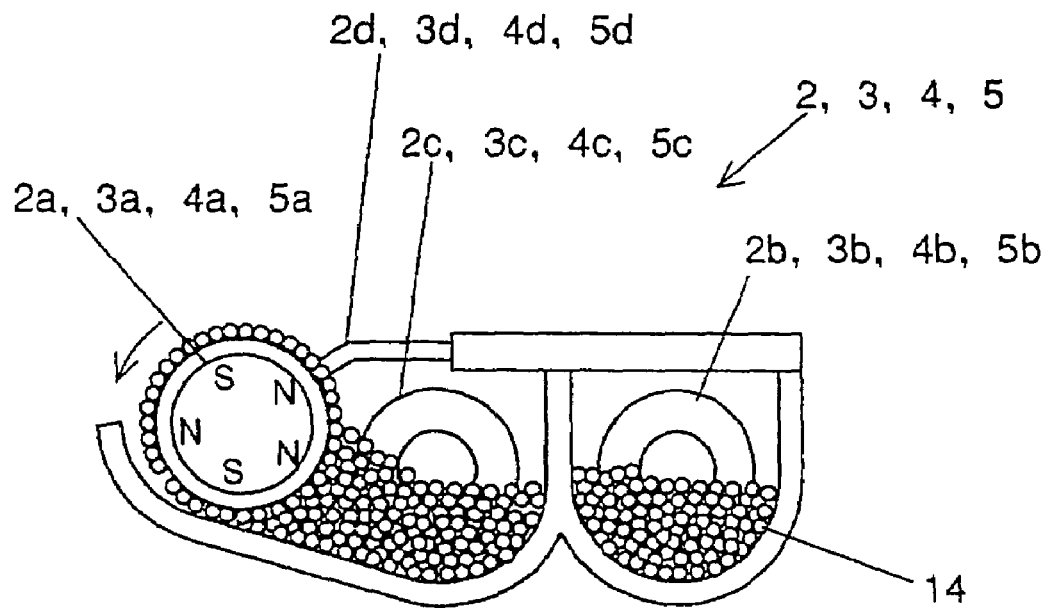
FIG. 4 is an explanatory drawing showing in detail the development part of the color image-forming apparatus of FIG. 1.
Figure 5:
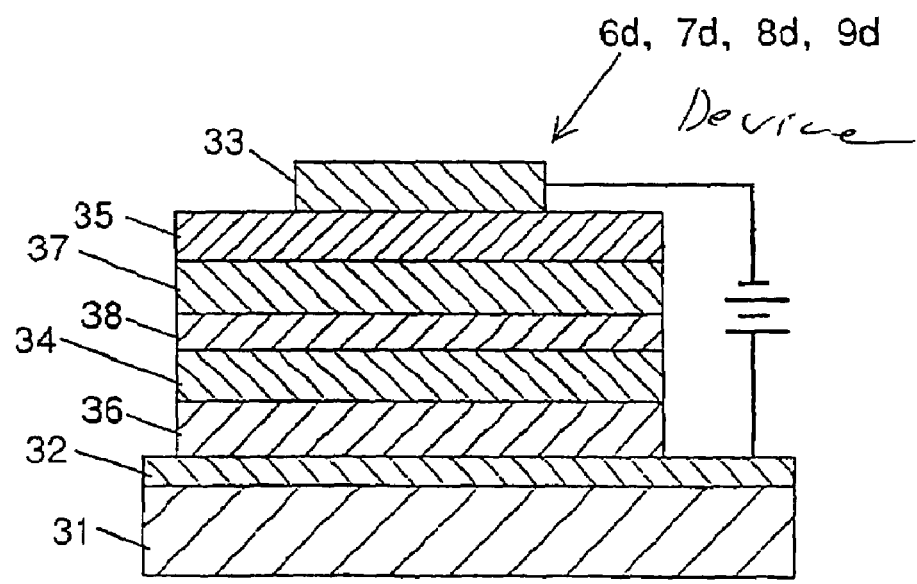
FIG. 5 is a cross-sectional view showing the essential part of the organic electroluminescence element used as the light sources for the exposure part of FIG. 2.
Figure 6:
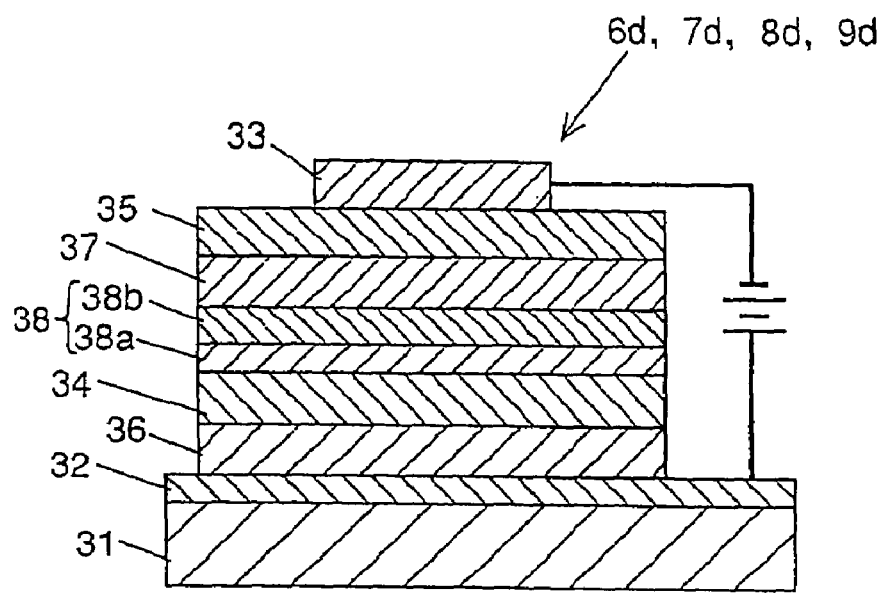
FIG. 6 is a cross-sectional view showing the essential part of a modified example of an organic electroluminescence element used as the light sources for the exposure part of FIG. 2.
Figure 10:
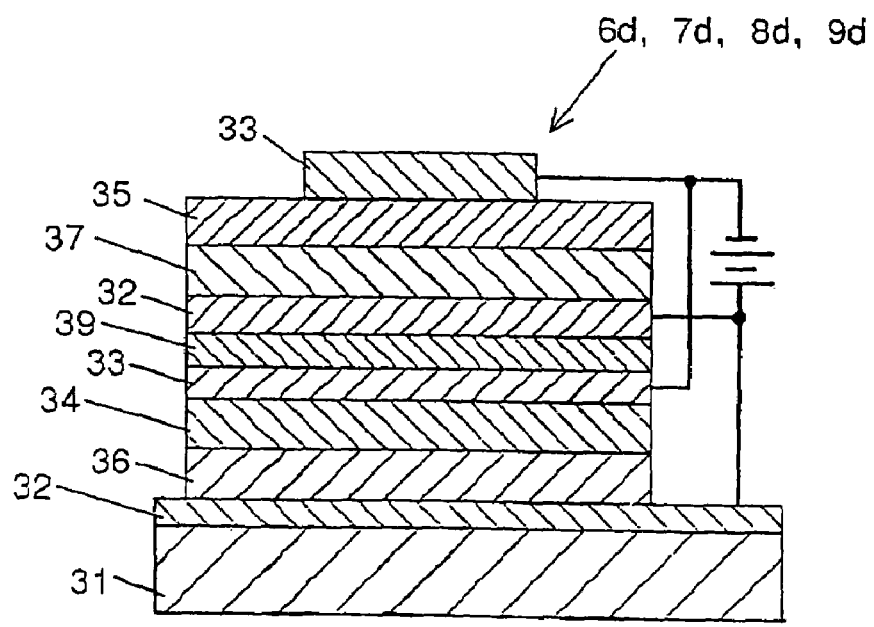
FIG. 10 is a cross-sectional view showing the essential part of the organic electroluminescence element used as the light sources for the exposure part of the color image-forming apparatus of the third embodiment for practicing the invention.

FIG. 1 is a schematic view showing the configuration of a color image-forming apparatus in the first embodiment of practicing the invention. FIG. 2 is an explanatory drawing showing in detail the exposure part of the color image-forming apparatus depicted in FIG. 1. FIG. 3 is an explanatory drawing showing in detail the photoreception part of the color image-forming apparatus depicted in FIG. 1. FIG. 4 is an explanatory drawing showing in detail the development part of the color image-forming apparatus depicted in FIG. 1. FIG. 5 is a cross-sectional view showing the essential part of an organic electroluminescence element used as the light source of the exposure part depicted in FIG. 2. And, FIG. 6 is a cross-sectional view showing the essential part of another modified example of the organic electroluminescence element used as the light source of the exposure part depicted in FIG. 2.

In FIG. 1, the color image-forming apparatus 1 is provided with development parts 2, 3, 4 and 5 arranged sequentially each acting to form a color toner image of yellow (Y), magenta (M), cyan (C) or black (K), and further with exposure parts (exposure units) 6, 7, 8 and 9, and photoreception parts 10, 11, 12 and 13 each corresponding to each development part 2, 3, 4 or 5.

As is depicted in FIG. 2, the exposure parts 6 to 9 are equipped with head supporting members 6a, 7a, 8a and 9a, organic electroluminescence elements 6d, 7d, 8d and 9d each of which acts as a light source and mounted on a support 6b, 7b, 8b or 9b and sealed air-tight with a sealing member 6c, 7c, 8c or 9c provided on head supporting members 6a, 7a, 8a and 9a, and drivers 6e, 7e, 8e and 9e which are mounted on the supports 6b, 7b, 8b and 9b and supply voltage corresponding to image data to the organic electroluminescence elements 6d to 9d to cause the elements to emit light. Furthermore, on the substrates 6b, 7b, 8b and 9b, there are mounted prisms 6f, 7f, 8f and 9f which deflect the light emitted from the organic eletroluminescence elements 6d to 9d, fiber arrays 6g, 7g, 8g and 9g which collect the lights from the prisms 6f to 9f, and cylindrical lenses 6h, 7h, 8h and 9h which collect the light from the fiber arrays 6g to 9g to the sub-scanning direction.

As is depicted in FIG. 3 in detail, the photoreception parts 10 to 13 comprise photoreceptor drums (photoreceptors) 10a, 11a, 12a and 13a as rotatable image carriers, and chargers (charging means) 10b, 11b, 12b and 13b which are placed impressed contact with the photoreceptor drums 10a to 13a and charge the surface of the photoreceptor drums 10a to 13a to a uniform potential, and cleaners 10c, 11c, 12c and 13c which remove the toner remaining on the photoreceptor drums 10a to 13a after image transfer.

The photoreceptor drums 10a to 13a which rotate in the circumferential direction are arranged in a line in such a manner that the rotating shafts are in parallel to each other. The chargers 10b to 13b in pressed contact with the photoreceptor drums 10a to 13a rotate along with the rotation of the photoreceptor drums 10a to 13a.

As is shown in detail in FIG. 4, the development parts 2 to 5 comprise development rollers (developing means) 2a, 3a, 4a and 5a which deposit toner on the photoreceptor drums 10a to 13a each bearing an electrostatic latent image on its outer surface by the action of the light emitted from the exposure parts 6 to 9 and convert the electrostatic latent images to visible ones, agitation members 2b, 3b, 4b and 5b which agitate toner 14 in tanks, supply rollers 2c, 3c, 4c and 5c which supply toner 14 to the development rollers 2a to 5a under agitation, and doctor blades 2d, 3d, 4d and 5d which adjust the layers of toner 14 supplied onto the development rollers 2a to 5a to a pre-determined thickness and charge toner 14 by friction.

As is shown in FIG. 1, at the positions facing these exposure parts 6 to 9, the photoreception parts 10 to 13 and the development parts 2 to 5, a transfer part 15 is arranged at which each toner image developed on one of the photoreceptor drums 10a to 13a is transferred onto a paper sheet (recording medium) P in superposition on each other to give a color toner image.

Each transfer part 15 is provided with a transfer roller 16, 17, 18 or 19 arranged to face each of the photoreceptor drums 10a to 13a, and spring 20, 21, 22 or 23 each of which presses each of the transfer rollers 16 to 19 onto each of the photoreceptor drums 10a to 13a.

In the opposite side of the transfer part 15, a paper-feeding part 24 which stocks paper sheets P is provided. And paper sheets P are taken out one by one from the paper-feeding part 24 by means of a paper-feeding roller 25.

On the paper transport path from the paper-feeding part 24 to the transfer part 15, a pair of registration rollers 26 is provided which feeds a paper sheet P to the transfer part 15 at a pre-determined timing. Further, on the paper transport path along which the paper sheet P runs holding the color toner images transferred at the transfer part 15, a fixing part 27 is formed. The fixing part 27 comprises a heating roller 27a and a pressure roller 27b in a pressed contact with the heating roller 27a. The color image transferred on the paper sheet P is fixed onto the paper sheet P by the pressure and heat generated during the nipping rotation with the rollers 27a and 27b.

In the image-forming apparatus of such configuration, first of all, an electrostatic latent image for the yellow color component of image information is formed on the photoreceptor drum 10a. This latent image is visualized into a yellow toner image on the photoreceptor drum 10a by means of the development roller 2a having the yellow toner. Meanwhile, the paper sheet P pulled out of the paper-feeding part 24 by means of the paper-feeding roller 25 is fed into the transfer part 15 in exact timing. Then, the sheet is nipped and conveyed by the photoreceptor drum 10a in conjunction with the transfer roller 16, and at this instant the above-described yellow toner image is transferred from the photoreceptor drum 10a.

During the transfer of the yellow toner image onto the paper sheet P, a latent image for the magenta color component is consequently formed, and is developed visible as a magenta toner image by means of the development roller 3a having the magenta toner. Then, on the paper sheet P onto which the yellow toner image has been transferred, the magenta toner image is transferred in superposed manner on the yellow toner image.

Further, in a similar way, image formation and transfer are conducted for cyan toner and black toner images, and superimposition of the four-color toner images completes on the paper sheet P.

Thereafter, the paper sheet P on which a color image has been formed is transported to the fixing part 27. In the fixing part 27, the transferred toner images are fixed onto the paper sheet P by heat, and a full-color image completes on the paper sheet P.

The paper sheet P, on which the series of color image-forming operations have thus finished, is then exhausted to a paper-exhausting tray 28.

The organic electroluminescence elements 6d, 7d, 8d and 9d which are the light sources equipped in the exposure parts 6 to 9 each comprise, as shown in FIG. 5, an anode 32 which comprises a transparent electro-conductive film formed on a substrate 31 by, for example, sputtering or resistive heating vapor deposition and acts as a hole injection electrode, and a cathode 33 which has been formed by, for example, resistive heating vapor deposition and acts as an electron injection electrode. Moreover, between the anode 32 and the cathode 33, there are formed a first light emission layer 34 having a light emission region and arranged at the side of the anode 32, and a second light emission layer 35 having a light emission region and arranged at the side of the cathode 33. Between the anode 32 and the first light emission layer 34, a first hole transport layer 36 is formed, and between the charge generation layer 38 and the second light emission layer 35, a second hole transport layer 37 is formed. In addition, between the first light emission layer 34 and the second light emission layer 35, a charge generation layer 38 which injects electrons into the first light emission layer 34 and injects holes into the second light emission layer 35 is formed.

When a dc voltage or dc current is applied by making the anode 32 of the organic electroluminescence element of such configuration a positive electrode, and making the cathode 33 a negative electrode, holes are injected into the first light emission layer 34 via the first hole transport layer 36 from the anode 32 along with electron injection from the charge generation layer 38. Into the second light emission layer 35, electrons are injected from the cathode 33, and at the same time holes are injected from the charge generation layer 38 via the second hole transport layer 37. In the first light emission layer 34 and the second light emission layer 35, the holes and electrons injected in this manner recombine, and excitons generated by such recombination cause light emission when the excitons shift from the excited state to the ground state.

Here, since light emission takes place in plural light emission layers, i.e., the first one 34 and the second one 35, the light quantity emitted from the organic electroluminescence element can be increased.

In the organic electroluminescence element of such configuration, the light emitted from the luminescent material constituting the light emission regions of the first and second light emission layers 34 and 35 radiates in all directions with the center of the luminescent material, and emerges through the substrate 31. Alternatively, once after emitted towards the direction opposite to the light-emerging direction (direction toward the substrate 31) and reflected by the cathode 33, then the light is irradiated through the substrate 31.

As a next step, each part composing the organic electroluminescence element will be described.

As the substrate 31 for the organic electroluminescence element in accordance with the invention, transparent or semi-transparent materials may be used; in cases where the substrate is not used as the light-emerging plane, an opaque material may be used. Any of these materials can be used so long as it has a sufficient strength for holding the organic electroluminescence element. By way of precaution, the definition of transparency or semi-transparency in the invention indicates such a degree of transparency as not to disturb the visual perception of the light emission by the organic electroluminescence element.

For the substrate 31, materials can be appropriately chosen from inorganic glass including inorganic oxide glass such as, for example, transparent or semi-transparent soda-lime glass, barium/strontium-containing glass, lead glass, aluminosilicate glass, borosilicate glass, barium borosilicate glass and quartz glass, inorganic fluoride glass, high polymer films made of transparent or semi-transparent poly (ethylene terephthalate), polycarbonate, poly(methyl methacrylate), poly(ether sulfone), poly(vinyl fluoride), polypropylene, polyethylene, acrylate polymer, amorphous polyolefin and fluorine-containing resin, chalcogenide glass such as transparent or semi-transparent $As_2S_3$, $As_{40}S_{10}$ and $S_{40}Ge_{10}$, metal oxides and nitrides such as ZnO, $Nb_2O_5$, $Ta_2O_5$, SiO, $Si_3N_4$, $HfO_2$ and $TiO_2$, semiconductor materials such as opaque silicon, germanium, silicon carbide, gallium arsenide and gallium nitride, transparent substrate materials enumerated above containing a pigment, and metal material which surface has been subjected to insulation treatment. In addition, laminated substrates resulting from stacking a plurality of substrate materials may also be used.

Further, on the surface of or within such a substrate, a circuit may be fabricated that comprises a resistor, condenser, inductor, diode or transistor and drives the organic electroluminescence element.

Still further, depending on the application, such materials as to transmit light only in a specified wavelength region or have a light-to-light conversion capability and convert impinging light to the one with a specified wavelength may be used. As for the resistivity of the substrate, though the substrate is preferably an insulator, there is no specific restriction, and the substrate should have a resistivity in the range not to hinder the driving of the organic electroluminescence element. In certain applications, the substrate may be electrically conductive.

As the anode 32 for the organic electroluminescence element, ITO (indium tin oxide), ATO (Sb doped $SnO_2$) and AZO (Al doped ZnO) can be used.

In the present embodiment, the hole transport layer 36 (37) and the light emission layer 34 (35) form an individual organic thin film layer of a double layer structure. In addition to such a structure, various structures may be adopted including a monolayer structure consisting of only a light emission layer, a double layer structure consisting of a light emission layer and an electron transport layer or a three-layer structure consisting of a hole transport layer, a light emission layer and an electron transport layer. Specifically, there may be used a structure in which, between the two electrodes of an anode 32 and an cathode 33, light emission layers 34 and 35 are provided with an intervening charge generation layer 38 without providing hole transport layers 36 and 37, or another structure in which only one of the hole transport layers 36 and 37 in FIG. 5 is provided. Further, still another structure may be used in which, without forming the second hole transport layer 37 in FIG. 5, a second light emission layer 35 is arranged at the position of the second hole transport layer 37 and in which an electron transport layer is formed at the position of the second light emission layer 35 in FIG. 5. Moreover, in FIG. 5, between the second light emission layer 35 and the cathode 33, an electron transport layer may be provided, or between the first light emission layer 34 and the charge generation layer 38, an electron transport layer may be provided. As has been described heretofore, the essential condition is that, between the two electrodes of anode 32 and cathode 33, at least a first light emission layer 34 and a second light emission layer 35 are formed with an intervening charge generation layer 38. And based on such layer structure, at least either of hole transport layers 36 or 37 may be arranged close to the anode (32) side of the light emission layers 34 and 35 if needed, and at least either of the electron transport layers may be arranged close to the cathode (33) side of the light emission layers 34 and 35 if needed.

As the light emission layers 34 and 35 of the organic electroluminescence element, materials which have a luminescent or phosphorescent property in the visible region and exhibit a good film-forming property are preferred including, in addition to Alq$_3$ and Be-benzoquinolinol (BeBq$_2$), benzoxazole-based fluorescent brightening agents such as 2,5-bis(5,7-di-t-pentyl-2-benzoxazolyl)-1,3,4-thiadiazole, 4,4'-bis(5,7-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)-thiophine, 2,5-bis(5-α,α-dimethylbenzyl)-2-benzoxazolyl)thiophene, 2,5-bis[5,7-di-(2-methyl-2-butyl)-2-benzoxazolyl]-3,4-diph enylthiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]ben zoxazolyl and 2-[2-(4-chlorophenyl)vinyl]naphtho[1,2-d]oxazole; benzothiazole-based fluorescent brightening agents such as 2,2'-(p-phenylenedivinylene)-bis-benzothiazole; benzimidazole-based fluorescent brightening agents such as 2-[2-[4-(2-benzimidazolyl)phenyl]vinyl]benzimidazole and 2-[2-(4-carboxyphenyl)vinyl]benzimidazole; 8-hydroxyquinoline-based metal complexes such as aluminum tris(8-quinolinol), magnesium bis(8-quinolinol), zinc bis(benzo[f]-8-quinolinol), aluminum oxide bis(2-methyl-8-quinolinolate), indium tris(8-quinolinol), aluminum tris(5-methyl-8-quinolinol), lithium 8-quinolinol, gallium tris(5-chloro-8-quinolinol), calcium bis(5-chloro-8-quinolinol) and poly[zinc-bis(8-hydroxy-5-quinolinonyl)methane]; metal chelated oxynoid compounds such as dilithium epindolidione; styrylbenzene-based compounds such as 1,4-bis(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)benzene and 1,4-bis(2-methylstyryl)2-methylbenzene; distyrylpyrazine derivatives such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis[2-(1-pyrenyl)vinyl]pyrazine; naphthalimide derivatives, perylene derivatives, oxadiazole derivatives, aldazine derivatives, cyclopentadiene derivatives, styrylamine derivatives, coumarine derivatives, and aromatic dimethylidyne derivatives. Moreover, anthracene, salicylic acid salt, pyrene and coronene can be used. Alternatively, phosphorescent light-emitting materials such as iridium fac-tris(2-phenylpyridine) or polymeric light-emitting materials such as PPV (poly(p-phenylenevinylene)) and polyfluorene may also be used. By way of precaution, the first light emission layer 34 and the second one may be composed of the same material or different ones.

As the hole transport layers 36 and 37 of the organic electroluminescence element, materials which exhibit a large hole mobility and a good film-forming property are preferred. Various organic compounds including the following ones can be used in addition to TPD; porphyrin compounds such as porphine, copper tetraphenylporphine, phthalocyanine, copper phthalocyanine and titanium phthalocyanine oxide; aromatic tertiary amines such as 1,1-bis{4-(di-p-tolylamino)phenyl}cyclohexane, 4,4',4"-trimethyltriphenylamine, N,N,N',N'-tetraquis(p-tolyl)-p-phenylenediamine, 1-(N,N-di-p-tolylamino)naphthalene, 4,4'-bis(dimethylamino)-2,2'-dimethyltriphenylmethane, N,N,N',N'-tetraphenyl-4,4'-diaminobiphenyl, N,N'-diphenyl-N,N'-di-m-tolyl-4,4'-diaminobiphenyl and N-phenylcarbazole; stilbene compounds such as 4-di-p-tolylaminostilbene and 4-(di-p-tolylamino)-4'-[4-(di-p-tolylamino)styryl]stilbene; triazole derivatives, oxadiazole derivatives, imidazole derivatives, polyarylalkane derivatives, pyrazoline derivatives, pyrazolone derivatives, phenylenediamine derivatives, anilamine derivatives, amino-substituted chalcone derivatives, oxazole derivatives, styrylanthracene derivatives, fluorenone derivatives, hydrazone derivatives, silazane derivatives, polysilane- and aniline-based copolymers, oligomers, styrylamine compounds, aromatic dimethylidyne-based compounds, poly-3,4-ethylenedioxythiophene (PEDOT) or poly-3-methylthiophene (PMeT). Also, a polymer dispersion-type hole transport layer can be used in which a low molecular weight organic material used for hole transport layers is dispersed in a high polymer material such as polycarbonate. These hole transport materials can be used as a hole injection materials or an electron blocking materials, too.

As the electron transport layer for the organic electroluminescence element, oxadiazole derivatives such as 1,3-bis(4-tert-butylphenyl-1,3,4-oxadiazolyl)phenylene (OXD-7), anthraquinodimethane derivatives, diphenylquinone derivatives and a polymer material comprising an oxadiazol derivative can be used. These electron transport materials can be used as electron injection materials or hole blocking materials, too.

As the cathode 33 for the organic electroluminescence element, metals or alloys with a low work function are used including metals such as Al, In, Mg and Ti, magnesium alloys such as Mg—Ag alloys and Mg—In alloys, aluminum alloys such as Al—Li alloys, Al—Sr alloys and Al—Ba alloys.

If these organic thin film layers constituted by the light emission layer or the hole transport layer provided on the light emission layer if necessary, or the electron transport layer provided on the light emission layer if necessary are formed by a polymer material, a damage can be relieved in the film formation when another material is to be provided on the organic thin film layers. Also in the case in which a sputtering method or a resistance heating evaporation method is used for a method of laminating another material on the organic thin film layer, the damage caused by the film formation can be more lessened as compared with the case in which the organic thin film layer is constituted by a depolymerized material if the organic thin film layer is constituted by the polymer material. Also in the case in which a plurality of organic thin film layers is provided, furthermore, it is possible to select a film forming method which less damages a lower layer if the organic thin film layers to be provided are constituted by the polymer materials.

Moreover, a film can be formed by a material in a small amount and a film thickness can be uniform in a large area for the film formation. Consequently, it is possible to fabricate an organic electroluminescence element having a large area. Moreover, a stability for the heat of the light emitting layer can be enhanced and the generation of a defect and a pinhole on an interface between the layers can be suppressed. Therefore, it is possible to form an organic electro luminescence unit having a high stability.

If these organic thin film layers are constituted by polymer materials, particularly, a damage on the charge generation layer to be provided thereon can be relieved in the film formation. Therefore, it is possible to form the charge generation layer by using an optional process on a layer provided in contact with the charge generation layer on the substrate side, that is, the organic thin film layer to be a lower layer in the formation of the charge generation layer.

Accordingly, the selectivity of the process for forming the charge generation layer can be increased so that the film can be formed by a simple process. Furthermore, the process for forming the charge generation layer is not limited. Consequently, the material of the charge generation layer can be properly selected from various materials and the selectivity of the material itself of the charge generation layer can be increased. In order to further relieve the damage on the organic thin film layer to be the lower layer in the film formation, it is preferable that the charge generation layer should be constituted by the polymer material. Thus, it is possible to select a film forming method causing a smaller damage on the lower layer as compared with the sputtering method.

In the case in which these organic thin film layers (the light emitting layer or the hole transport layer or electron transport layer formed if necessary) are to be formed by polymer materials, it is also possible to use a wet film forming method such as a spin coating method, a casting method, a dipping method, a bar code method or a roll coating method. Consequently, a large-scaled vacuum device is not required. Thus, the film formation can be carried out by inexpensive equipment, and furthermore, an organic electroluminescence element having a large area can be fabricated easily. In addition, an adhesion between the layers of the organic electroluminescence element can be enhanced. Therefore, a short circuit in the unit can be suppressed and the organic electroluminescence element having a high stability can be formed.

It is desirable that a heating and drying temperature for forming a light receiving region should not exceed the glass transition temperature of any polymeric organic matter used in the formed layers in order not to damage the layers formed in advance. In particular, it is desirable that the drying temperature of the light emission layer on the closer side to a cathode (or the hole transport layer or the electron transport layer which is formed if necessary) should not exceed the glass transition temperature of the light emission layer on the closer side to an anode (or the hole transport layer or the electron transport layer which is formed if necessary). In this case, it is possible to form the light emission layer on the closer side to the cathode without damaging the light emission layer on the closer side to the anode. Consequently, it is possible to easily form an organic electroluminescence element having a multilayer structure.

As the charge generation layer 38 of the organic electroluminescence element, materials that are transparent to the light emitted from the light emission layer, and capable of efficiently injecting hole-electron pairs, including, for example, metal oxides such as ITO (indium-tin oxide) and $V_xO_5$ (vanadium oxide), and organic materials such as 4F-TCNQ (tetrafluoro-tetracyanoquinodimethane) may also be used. Particularly when the light emission layer is made of a high polymer organic film, a high polymer organic material should preferably used for the charge generation layer is preferably made of whereby damages during film formation can be mitigated. At the same time, since the charge generation layer and the light emission layer can be fabricated in the form of film by similar methods, an organic electroluminescence element comprising multiple layers stacked on each other can be produced by a simplified process.

In addition to the above-cited materials, various materials such as conductors, semi-conductors, dielectrics and insulators, or stacked films obtained by laminating plural materials can also be used for the charge generation layer 38.

In particular, it is preferable that a material referred to as a "widegap semiconductor" should be used. Examples of the material include $MoO_x$, $SiO_x$, $MgO_x$, $CaO_x$, $ZnO_x$, $TiO_x$, $VO_x$, $BiO_x$, $FeO_x$, $GaO_x$, $GdO_x$, $TaO_x$, $NbO_x$, $WO_x$, $ZrO_x$, AlN, CdS, CdSe, CdTe, GaN, GaP and ZnSe. More specifically, it is preferable to use $MoO_3$, SiO, MgO, CaO, ZnO and $TiO_2$. Alternatively, it is also possible to use a material obtained by mixing a plurality of materials of the wide gap semiconductor, for example, a material such as $SiO_2/MgO$, $Mo_3/Al_2O_3$ or $ZnO/SiO_2$.

In the invention, materials called "wide gap semiconductor" are presumed at least to have the capability of charge generation, but considered to be different from so-called conductors in this capability. Though the close mechanism in these "wide gap semiconductors" is not clear yet, the layer made of such a "wide gap semiconductor" is defined to be different from the charge generation layer by imparting the nomenclature of buffer layer. Accordingly, in cases where the charge generation layer 38 mentioned above or to be described hereinafter is made of a "wide gap semiconductor", the layer is expressed as a buffer layer.

In an organic electroluminescence element having a structure described heretofore, when the charge generation layer 38 is made of a conductor, the work function of the charge generation layer 38 is set higher than the ionization potential of the second light emission layer 35. Alternatively, when the charge generation layer 38 is made of a semiconductor, dielectric or insulator, it is desirable to configure the electron affinity of the charge generation layer 38 to be lower than the electron affinity of the first light emission layer 34, and the ionization potential of the charge generation layer 38 to be higher than the ionization potential of the second light emission layer 35.

Such configuration is due to the following mechanism. When the electron affinity of the charge generation layer 38 is lower than that of the first light emission layer 34, the efficiency of electron injection from the charge generation layer 38 to the first light emission layer 34 is enhanced, and when the work function of the charge generation layer 38 is higher than the ionization potential of the second light emission layer 35, or when the ionization potential of the charge generation layer 38 is higher than the ionization potential of the second light emission layer 35, the efficiency of hole injection from the charge generation layer 38 to the second light emission layer 35 is enhanced. Accordingly, the quantities of light emitted from the first light emission layer 34 and the second one 35 increase, resulting in a further increase of the emitted light quantity of the organic electroluminescence element.

By way of precaution, in the case where the charge generation layer 38 is made of an inorganic material, it is ordinary that the ionization potential of the second light emission layer 35 is higher than that of the charge generation layer 38. Under such condition, the efficiency of hole injection from the charge generation layer 38 to the second light emission layer 35 can be made high without lowering the hole injection efficiency by making the potential difference between the two layers as small as possible, specifically, for example, 0.6 eV or smaller, even when the ionization potential of the charge generation layer is lower than that of the second light emission layer.

The ionized potential indicates an energy required for completely taking one electron from a neutral atom or molecule to the outside, the work function indicates an energy required for completely taking an electron from a metal or the crystal surface of a semiconductor to the outside, and the electron affinity indicates an energy to be discharged for adding one electron to a neutral atom or molecule and is generally represented by a difference from a vacuum level. The magnitude of the energy in the invention implies the absolute value of an energy value, and a high work function indicates that the absolute value of the energy value of the work function is great.

And, by adopting such an organic electroluminescence element as the light source for an exposure part, it is possible to attain a level of light quantity required for image exposure without making the apparatus bulky.

Moreover, by using such an exposure unit for an image-forming apparatus, a compact apparatus results.

By way of precaution, as shown in FIG. 6, the charge generation layer 38 can be a double-layer structure comprising a first generation layer 38a arranged close to the first light emission layer 34 and a second generation layer 38b arranged close to the second light emission layer 35, or a multi-layer structure comprising still more layers.

In such multi-layer structures, it is preferred to set the electron affinity of the first generation layer 38a lower than that of the second generation layer 38b, and the ionization potential of the second generation layer 38b higher than that of the first generation layer 38a.

Further, the layer which is first fabricated in the form of film (the first generation layer 38a or the second one 38b) is preferably fabricated by resistive heating in order to avoid the damaging of the first light emission layer 38a during the film-forming step for forming, for example, the first generation layer 38a on the first light emission layer 34. A generation layer to be fabricated thereafter can be made by sputtering, plazma CVD, ion beam or electron beam deposition.

In the case where a dielectric material is used for the charge generation layer 38, it is preferred to set the relative permittivity of the charge generation layer 38 larger than those of the first light emission layer 34 and the second one 35. For example, the relative permittivity of the charge generation layer 38 is set at roughly 8 to 10 while the relative permittivities of the first and second light emission layers 34 and 35 are set at about 3.

In the light emission layer and the hole transport layer arranged between the first fabricated electrode (anode 32 or cathode 33) and the charge generation layer 38 (i.e., the light emission layer 34 and the first hole transport layer 36 when the anode 32 has been fabricated first; and the second light emission layer 35 and the second hole transport layer 37 when cathode 34 has been fabricated first), the one adjacent to charge generation layer 38, in other words, the one adjacent to the charge generation layer 38 in the layers including the light emission layers, should preferably be made of a high polymer material since it is less subject to damaging during the formation of the charge generation layer 38. In the cases of a monolayer structure consisting of a light emission layer, a double-layer structure consisting of a light emission layer and an electron transport layer, and a tri-layer structure consisting of a hole transport layer, a light emission layer and an electron transport layer, the layer adjacent to charge generation layer 38 is made of a high polymer material in these layers.

(Second Embodiment)

Figure 7:
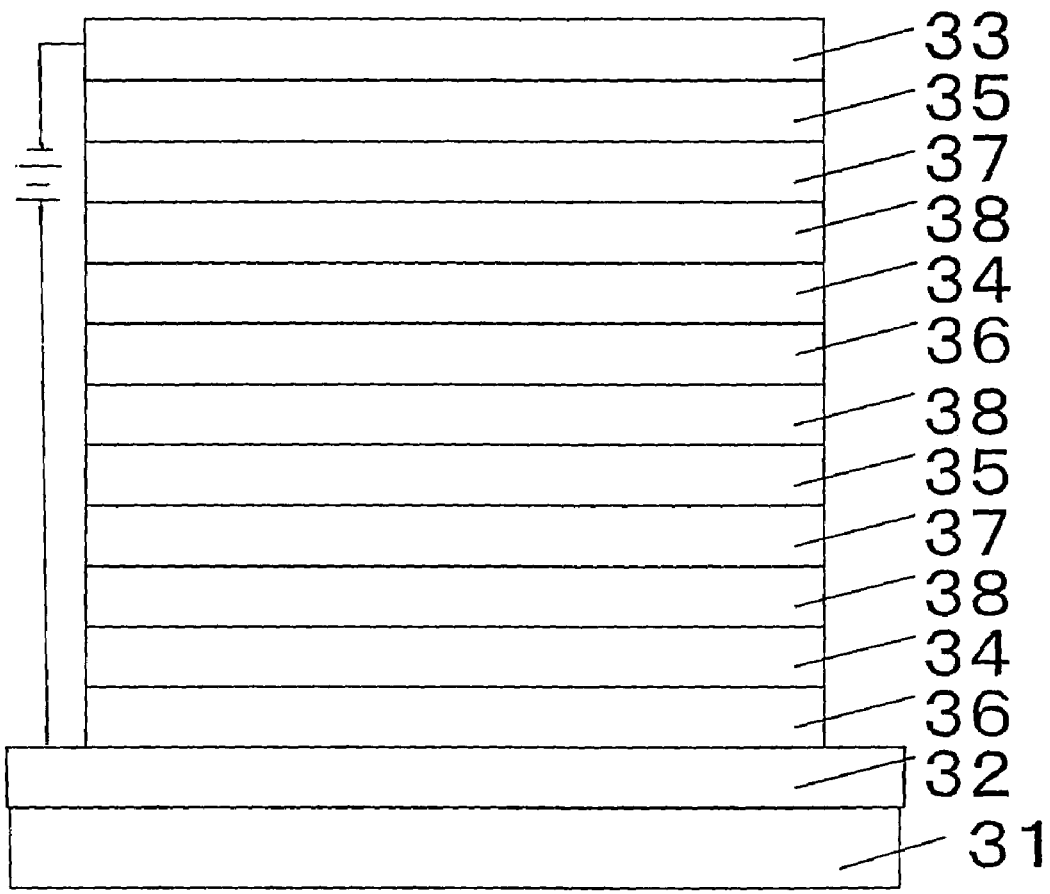
FIG. 7 is a cross-sectional view showing the essential part of the organic electroluminescence element used as the light sources for the exposure part of the color image-forming apparatus of the second embodiment for practicing the invention.

FIG. 7 is a cross-sectional view showing the essential part of an organic electroluminescence element used as the light source of the exposure part for the color image-forming apparatus in the second embodiment for practicing the invention. For confirmation, in the present embodiment, the configuration and the details of the color image-forming apparatus are the same as depicted in FIGS. 1 to 4 used in the first embodiment.

The depicted organic electroluminescence element as the exposure light source has a structure comprising, on a substrate 31, an anode 32, a first hole transport layer 36, a first light emission layer 34, a charge generation layer 38, a second hole transport layer 37, a second light emission layer 35, another charge generation layer 38, a third hole transport layer 36, a third light emission layer 34, still another charge generation layer 38, a fourth hole transport layer 37, a fourth light emission layer 35 and a cathode 33, all stacked sequentially. In the present embodiment, the element has a structure in which four light emission layers are arranged with intervening charge generation layers 38. And the first and third light emission layers have a common configuration just as the second and fourth ones have. However, as for the number as well as arrangement of the light emission layers is not limited to the present case, but can be arbitrarily designed by arranging charge generation layers between arbitrarily constituted light emission layers.

When a dc voltage or dc current is applied by making the anode 32 of the organic electroluminescence element of such configuration a positive electrode, and making the cathode 33 a negative electrode, holes are injected into the first light emission layer 34 via the first hole transport layer 36 from the anode 32 provided on the substrate 31 along with electron injection from the charge generation layer 38 sandwiched by the first and second light emission layers; into the second light emission layer 35, holes are injected from the charge generation layer 38 sandwiched between the first and second light emission layers via the second hole transport layer 37, and at the same time electrons are injected from the charge generation layer 38 sandwiched by the second and third light emission layers; into the third light emission layer 34, holes are injected from the charge generation layer 38 sandwiched by the second and third light emission layers via the third hole transport layer 36 along with electron injection from the charge generation layer 38 sandwiched by the third and fourth light emission layers; and into the fourth light emission layer 37, holes are injected from the charge generation layer 38 sandwiched by the third and fourth light emission layers via the fourth hole transport layer 38, and at the same time electrons are injected from the cathode 33. In the first, second, third and fourth light emission layers 34 (35), the electrons and holes injected in this manner recombine, and excitons generated by such recombination cause light emission when the excitons shift from the excited state to the ground state.

Thus, the light quantity emitted by the organic electroluminescence element can be increased with the configuration described above, since light emission takes place in the plural light emission layers, i.e., the first, second, third and fourth light emission layers 34 (35).

Figure 8:
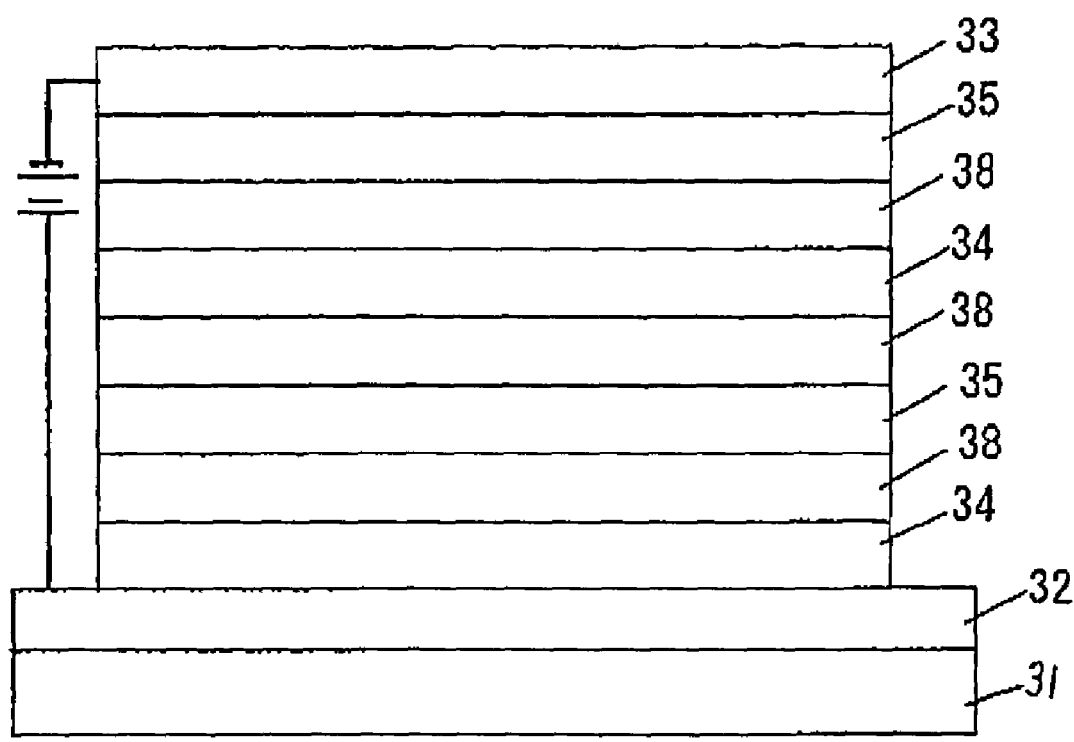
FIG. 8 is a sectional view showing the main part of an organic electroluminescence element according to another example which is used as the light source of the exposing section of a color imaging apparatus according to a second embodiment of the invention.
Figure 9:
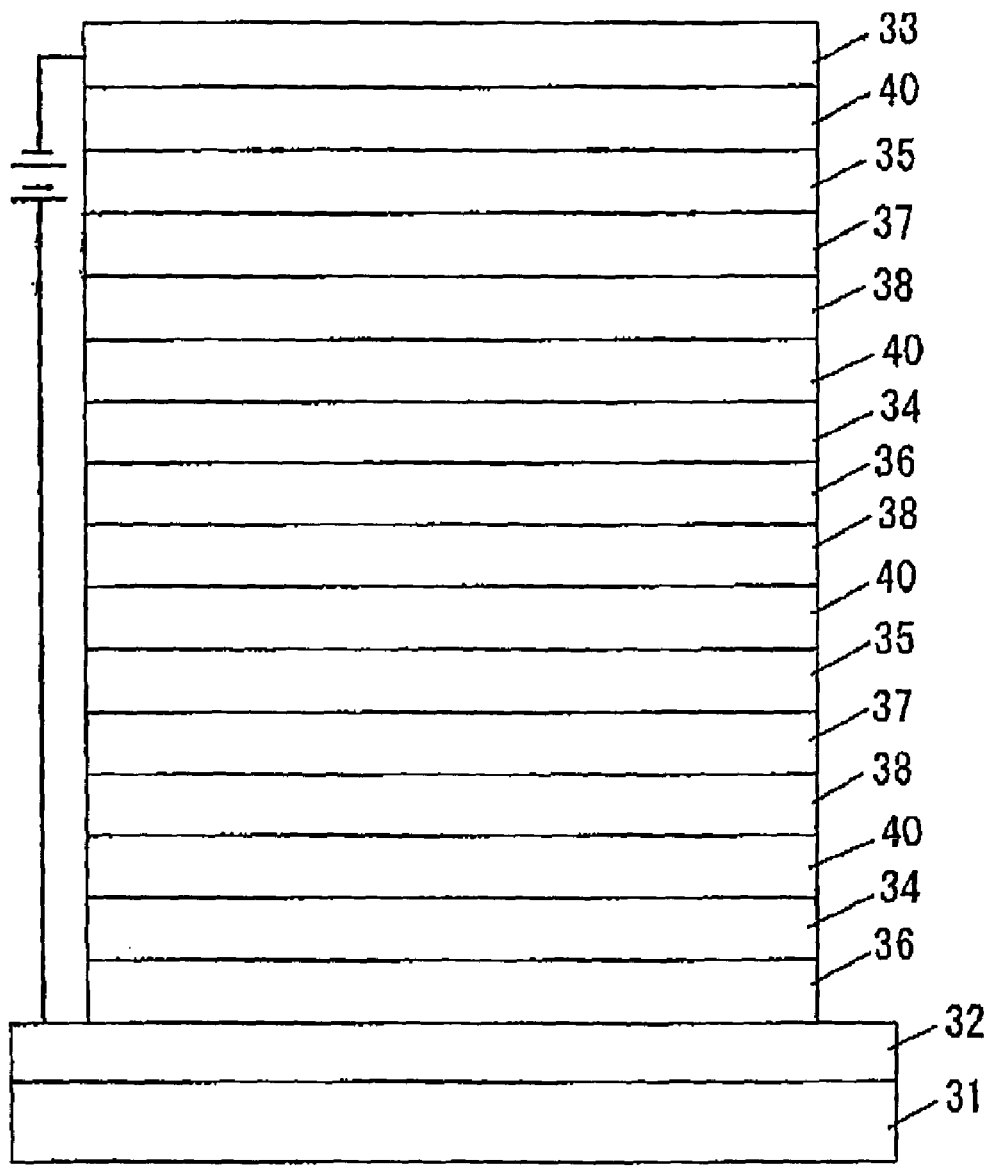
FIG. 9 is a sectional view showing the main part of an organic electroluminescence element according to a further example which is used as the light source of the exposing section of the color imaging apparatus according to the second embodiment of the invention.
Figure 11:
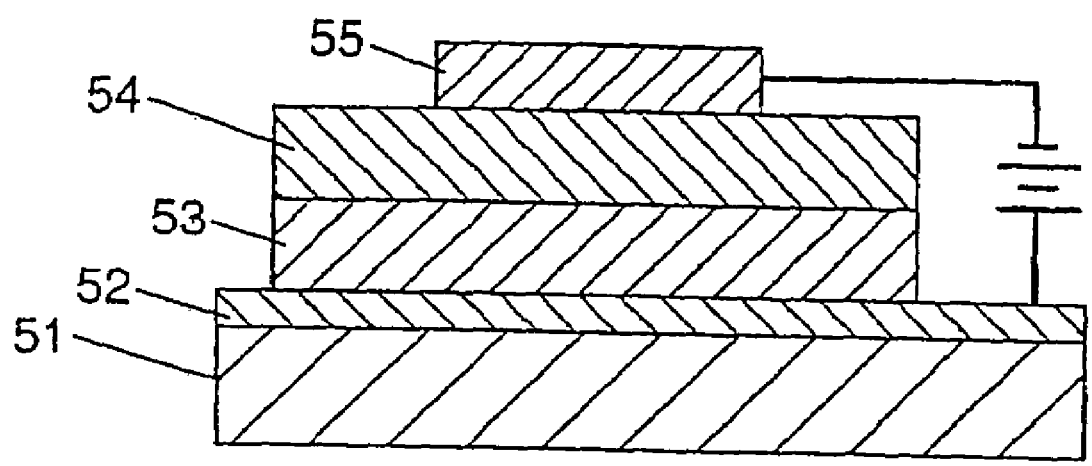
FIG. 11 is a cross-sectional view showing the essential part of a conventional organic electroluminescence element.
Figure 12:
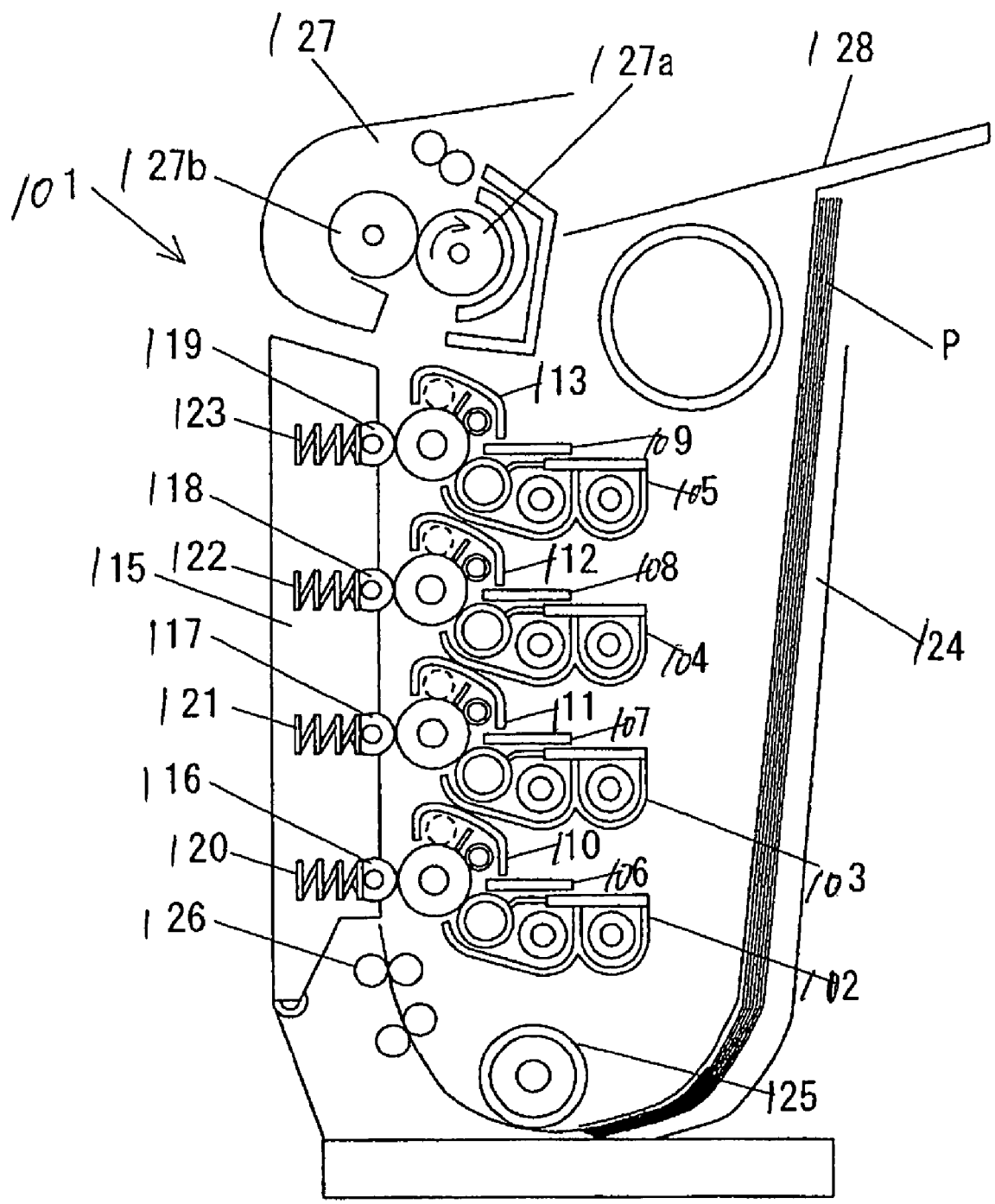
FIG. 12 is a schematic view showing the configuration of a color image-forming apparatus in the fourth embodiment for practicing the invention.
Figure 13:
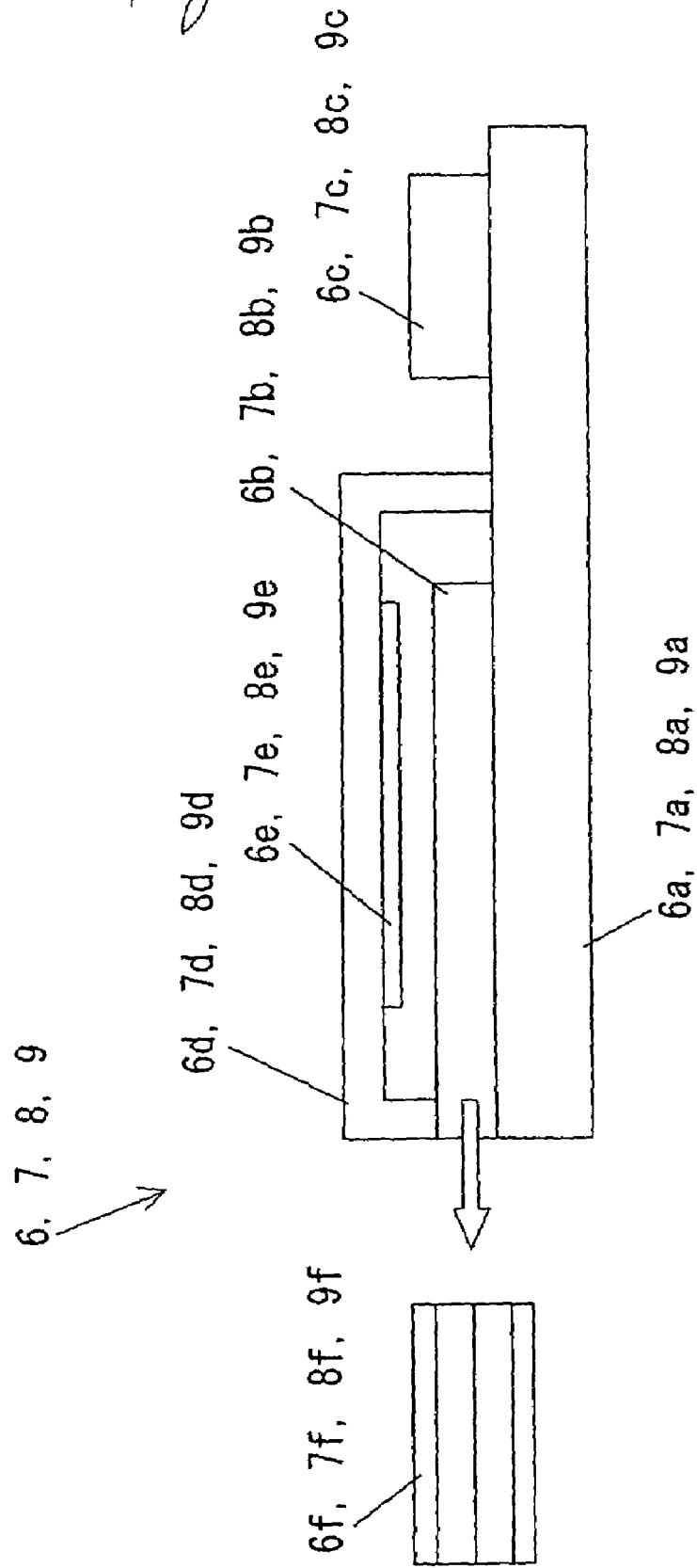
FIG. 13 is an explanatory drawing showing in detail the exposure part of the color image-forming apparatus of FIG. 12.
Figure 14:
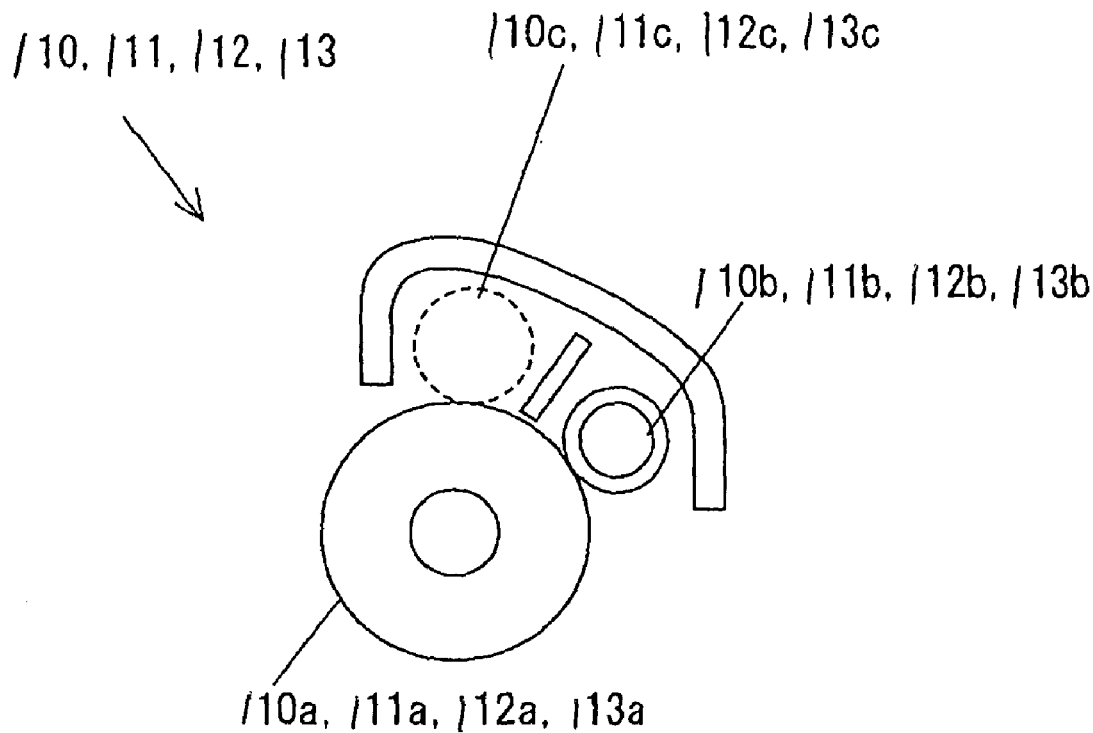
FIG. 14 is an explanatory drawing showing in detail the photoreceptive part of the color image-forming apparatus of FIG. 12.
Figure 15:
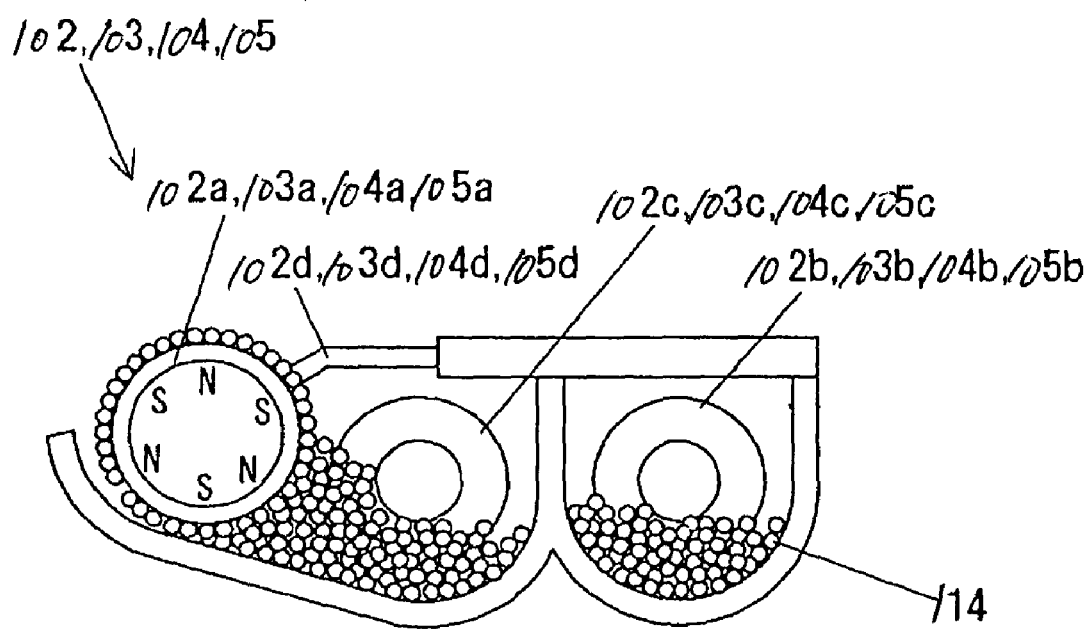
FIG. 15 is an explanatory drawing showing in detail the development part of the color image-forming apparatus of FIG. 12.
Figure 16:
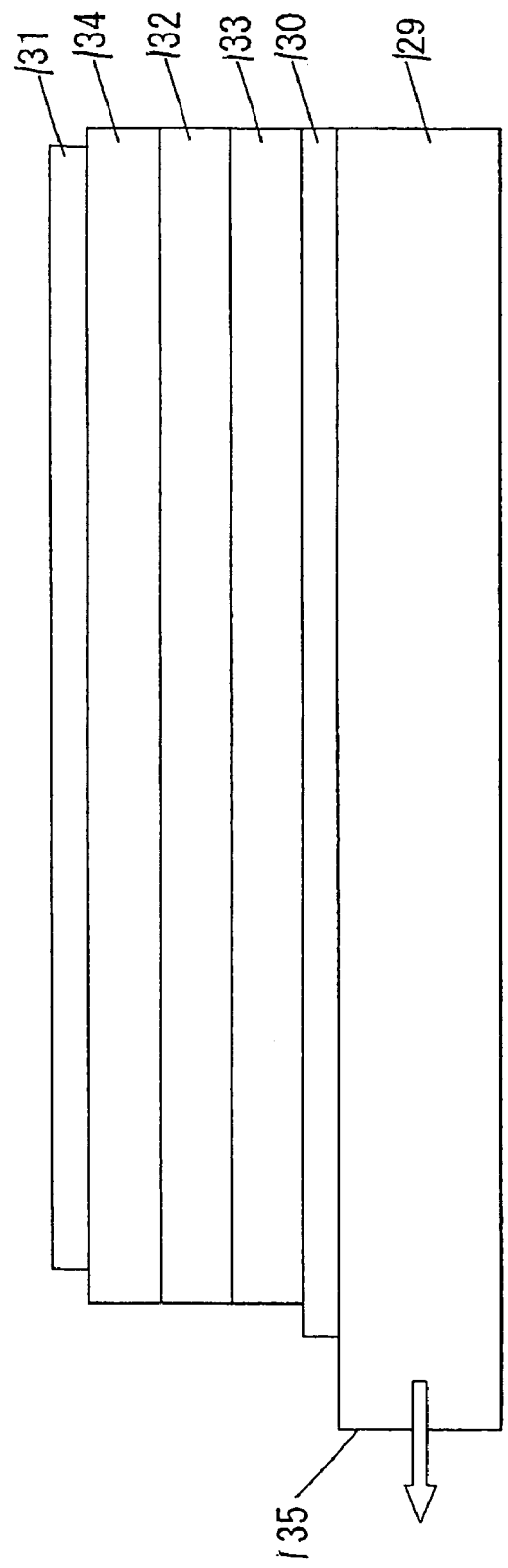
FIG. 16 is a cross-sectional view showing the organic electroluminescence element used as the light sources for the exposure part of FIG. 13.
Figure 17:
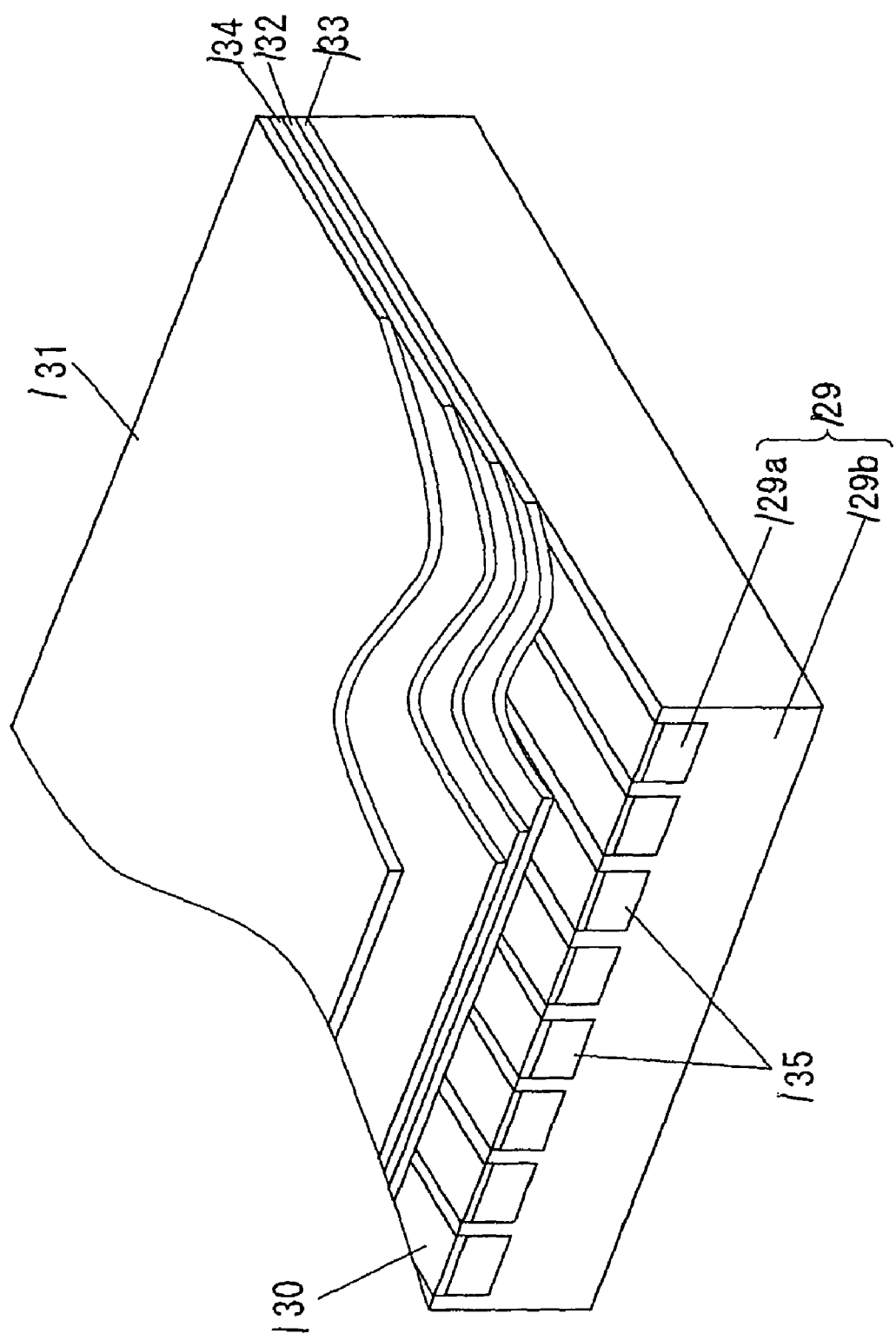
FIG. 17 is a perspective view showing the essential part of the organic electroluminescence element used as the light sources for the exposure part in FIG. 13.
Figure 18:
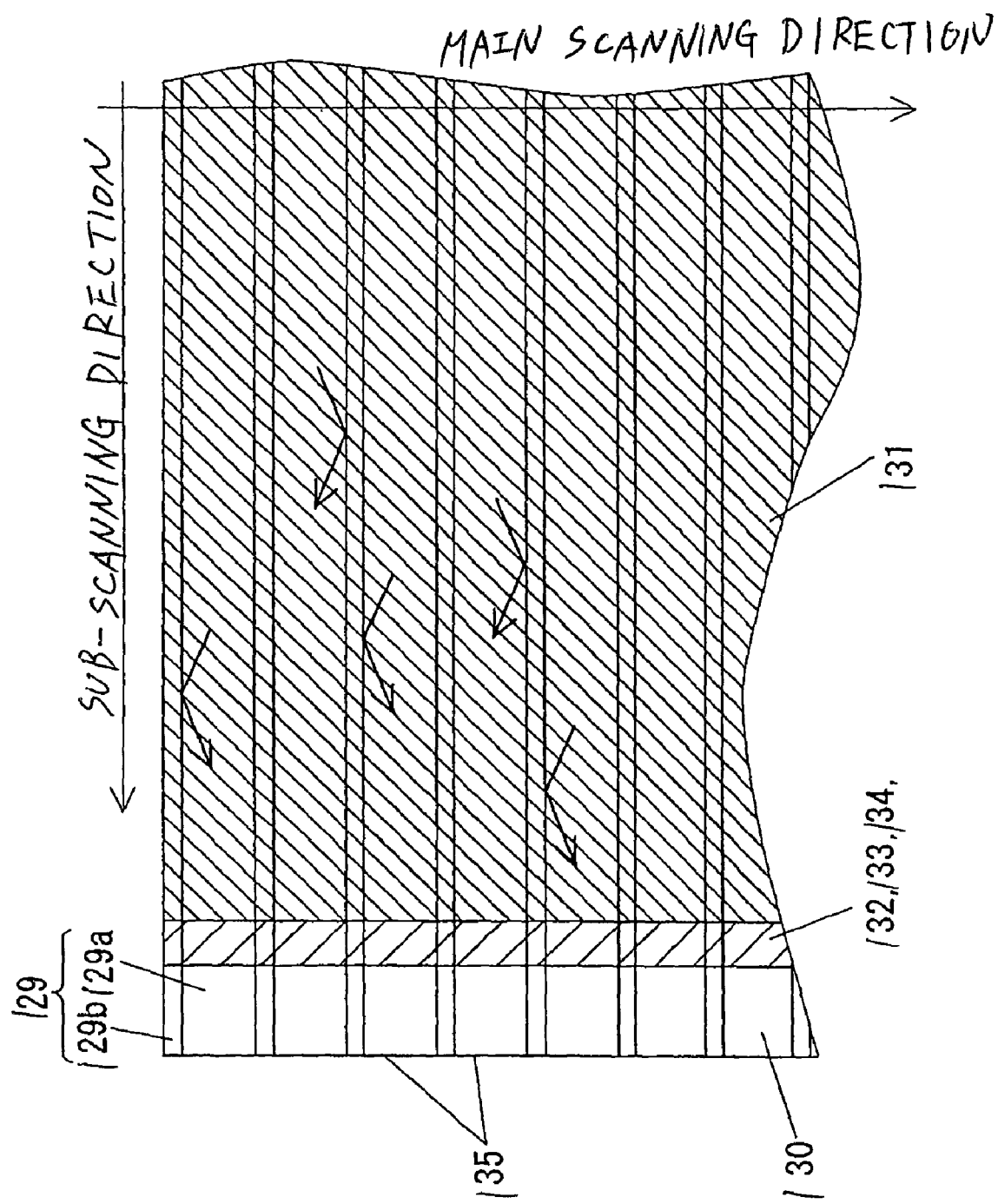
FIG. 18 is a plane view showing the organic electroluminescence element used as the light sources for the exposure part in FIG. 13.
Figure 19:
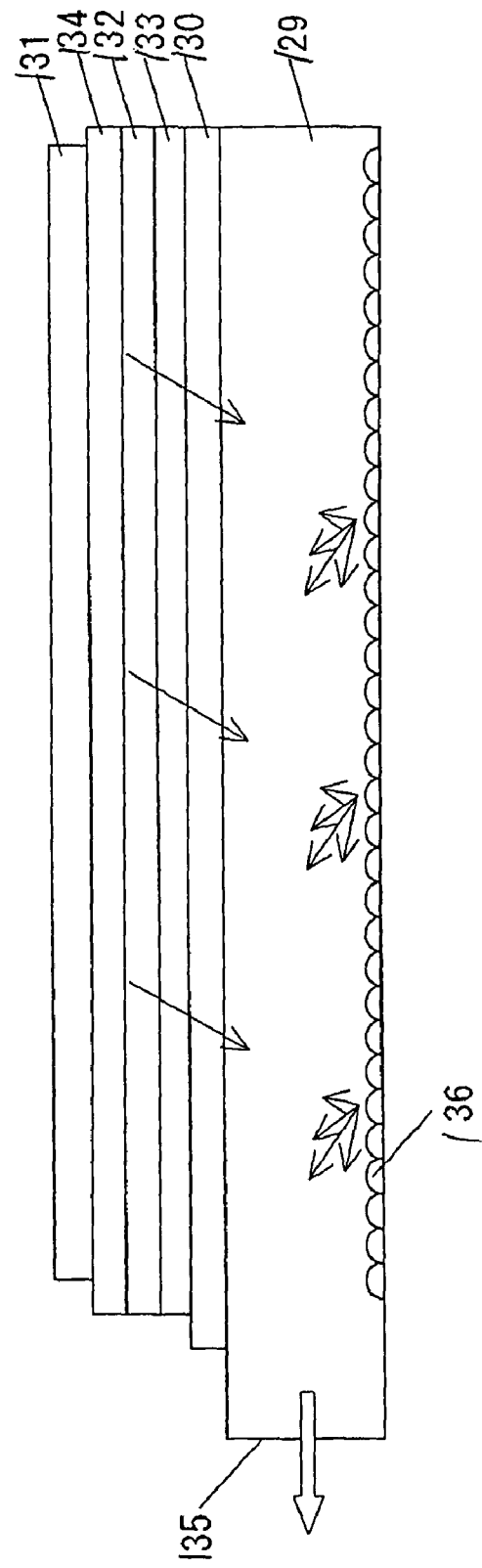
FIG. 19 is a cross-sectional view showing a modified example of the organic electroluminescence element used as the light sources for the exposure part in FIG. 13.
Figure 20:
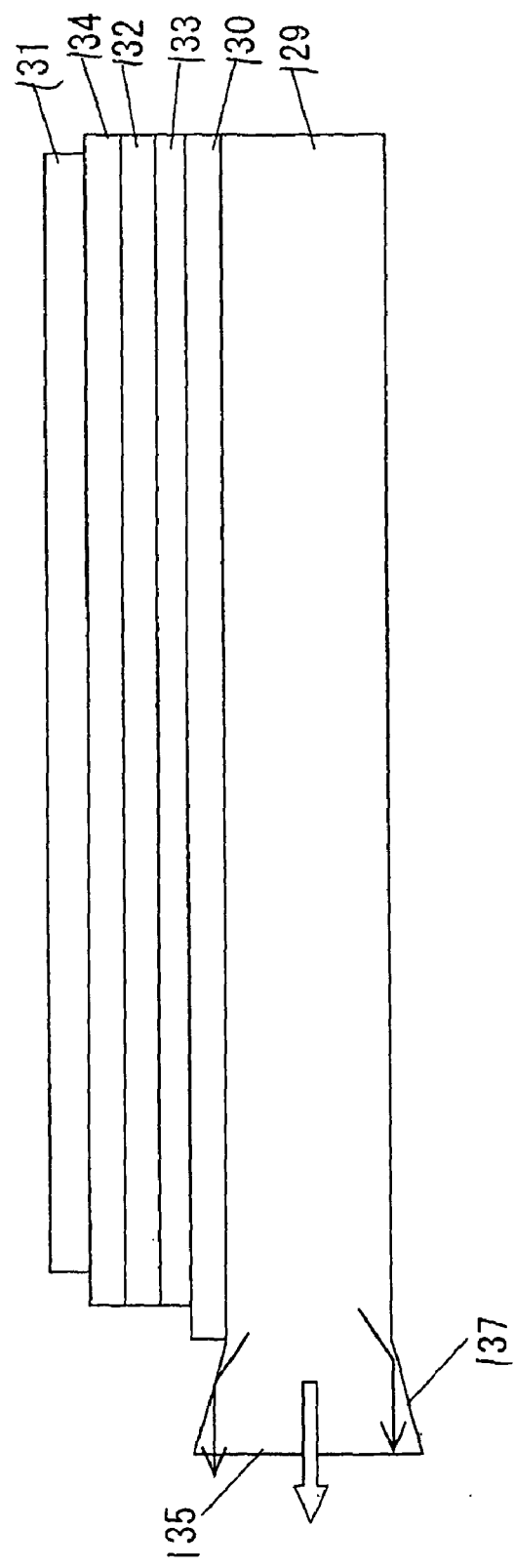
FIG. 20 is a cross-sectional view showing still another modified organic electroluminescence element used as the light sources for the exposure part in FIG. 13.

By way of precaution, in the present embodiment, each of the organic thin films consist of a double-layer structure with the hole transport layer 36 (37) and the light emission layer 34 (35). In addition to such structure, as shown in FIG. 8, a monolayer structure-consisting of a light emission layer and a double-layer structure consisting of a light emission layer and an electron transport layer, as shown in FIG. 9, a tri-layer structure consisting of a hole transport layer, a light emission layer and an electron transport layer may also be adopted. FIGS. 8 and 9 are sectional views showing the main part of an organic electroluminescence element according to another example which is used as the light source of the exposing section of a color imaging apparatus according to a second embodiment of the invention. In FIG. 9, 40 denotes an electron transport layer. In case of the two-layer structure including the light emission layer and the electron transport layer, moreover, the first to fourth hole transport layers 36 (37) shown in FIG. 9 are not present.

Further, in the present embodiment, the light emission layers and the hole transport layers arranged between the anode and cathode are preferably formulated with high polymer material which is less subject to damaging. In a monolayer structure consisting of a light emission layer, a double-layer structure consisting of a light emission layer and an electron transport layer, and a tri-layer structure consisting of a hole transport layer, a light emission layer and an electron transport layer, any layer of these is preferably made of high polymer material. Further, all of the light emission layers and the hole transport layers may be made of high polymer material whereby the charge generation layers may be formulated with a polymerized organic film. Moreover, in cases where the element configuration uses high polymer material, the light emission layer or charge generation layer is preferably fabricated by a wet film-forming process for the purpose of reducing material loss during element production. And, the drying temperature for an organic layer arranged close to the cathode in such wet process film formation preferably should not exceed the glass transition temperature of the organic film arranged closer to the anode than the layer to be dried.

In the description hereinabove, the organic electroluminescence element as the exposure light source is driven by dc; however, it may be driven by ac voltage or ac current, or further by wave pulse.

Though the exposure light emitted from the organic electroluminescence element emerges from the substrate (31) side, other designs are possible in which the light emerges from the opposite side relative to the substrate 31 (i.e., from the cathode side) or in which the light emerges sideways.

Though the above explanation has been made for the case where the invention is applied to a color image-forming apparatus, the invention can be applied to a mono-chromatic (for example, black) image-forming apparatus. In cases where the invention is applied to a color image-forming apparatus, the developing colors are not restricted to the four colors of yellow, magenta, cyan and black.

(Third Embodiment)

Figure 22:
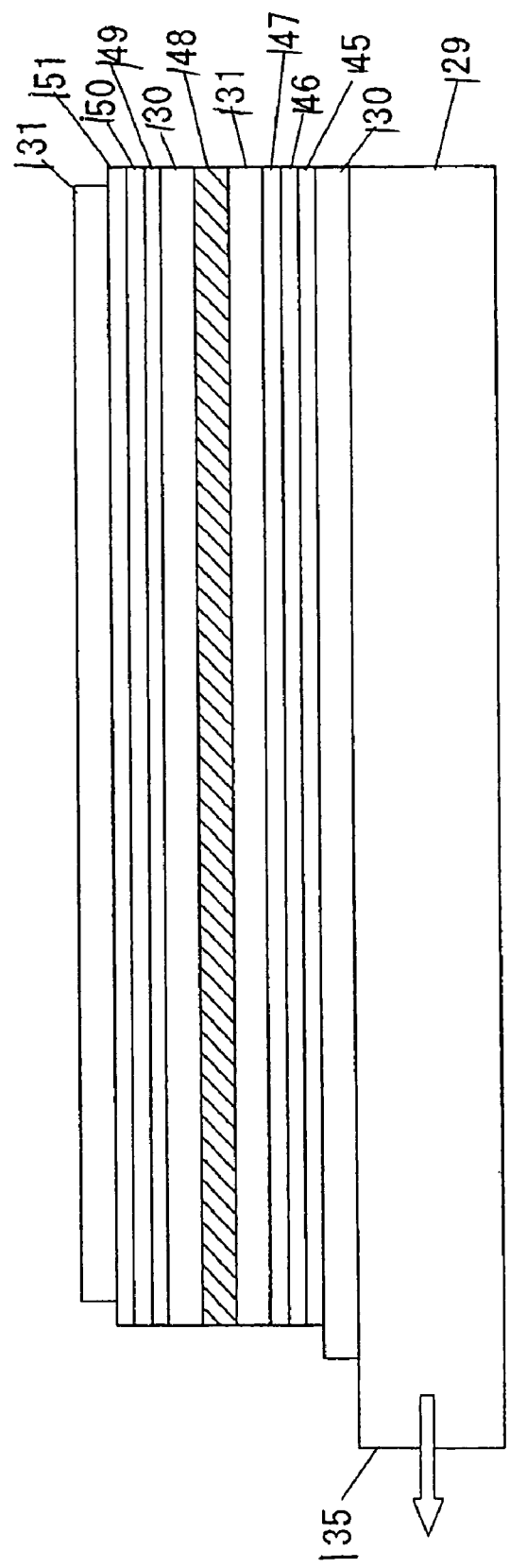
FIG. 22 is a cross-sectional view showing the organic electroluminescence element used as the light sources for the exposure part of the color image-forming apparatus for the sixth embodiment for practicing the invention.

FIG. 22 is a cross-sectional view showing the essential part of an organic electroluminescence element used as the light source of the exposure part for the color image-forming apparatus in the third embodiment for practicing the invention. For confirmation, in the present embodiment, the configuration and the details of the color image-forming apparatus are the same as depicted in FIGS. 1 to 4 used in the first embodiment.

The depicted organic electroluminescence element as the exposure light source has a structure comprising, provided on a substrate 31, an anode 32, a first hole transport layer 36, a first light emission layer 34, a cathode 33, an insulating layer 39, an anode 32, a second hole transport layer 37, a second light emission layer 35 and another cathode 33, all stacked in turn. In other words, in the structure, the anodes 32 and the cathodes 33 are arranged alternately each with the intervening light emission layer 34 (35) and hole transport layer 36 (37).

By way of precaution, all the anodes and cathodes need not always sandwich the light emission layer or other ones, but, as is exemplified by the spatial relation of the anode 32 to the cathode 33 both being inter-layers in FIG. 22, may sandwich an insulating layer 39, i.e., a layer other than a light emission layer.

When a dc voltage or dc current is applied by making the anode 32 of the organic electroluminescence element of such configuration a positive electrode, and making the cathode 33 thereof a negative electrode, holes are injected into the first light emission layer 34 via the first hole transport layer 36 from the anode 32 at the substrate (31) side along with electron injection from the cathode 33 lying at the insulating layer (39) side; and into the second light emission layer 35, electrons are injected from the uppermost cathode 33, and at the same time holes are injected from the anode 32 lying at the insulating layer (39) side via the second hole transport layer 37. In the first light emission layer 34 and the second light emission layer 35, the holes and electrons injected in this manner recombine, and excitons generated by such recombination cause light emission when the excitons shift from the excited state to the ground state.

Accordingly, the light quantity emitted by the organic electroluminescence element can be increased also with the configuration described above, since light emission takes place in plural light emission layers, i.e., the first and second light emission layers (34 and 35).

To make sure, the insulating layer 39 may be omitted in some cases. Also in the present embodiment, each of the organic thin film layers assumes a double-layer structure consisting of a hole transport layer 36 (37) and a light emission layer 34 (35). In addition to such configuration, a monolayer structure consisting of a light emission layer, a double-layer structure consisting of a light emission layer and an electron transport layer, and a tri-layer structure consisting of a hole transport layer, a light emission layer and an electron transport layer may also be adopted.

Moreover, in the case shown in the figure, the two anodes 32 and two cathodes 33 are alternately arranged, but it is sufficient that at least one anode and one cathode are arranged alternately.

In the present embodiment, the light emission layers and hole transport layers arranged between the first fabricated electrode and the subsequently fabricated one are preferably formulated with high polymer material which is less subject to damaging. In a monolayer structure consisting of a light emission layer, a double-layer structure consisting of a light emission layer and an electron transport layer, and a tri-layer structure consisting of a hole transport layer, a light emission layer and an electron transport layer, any layer of these is preferably made of high polymer material.

In the description hereinabove, the organic electroluminescence element as the exposure light source is driven by dc; however, it may be driven by ac voltage or ac current, or further by wave pulse.

Though the exposure light emitted from the organic electroluminescence element emerges from the substrate (31) side, other designs are possible in which the light emerges from the opposite side relative to the substrate 31 (i.e., from the cathode side) or in which the light emerges sideways.

Though the above explanation has been made for the case where the invention is applied to a color image-forming apparatus, the invention can be applied to a monochromatic (for example, black) image-forming apparatus. In cases where the invention is applied to a color image-forming apparatus, the developing colors are not restricted to the four colors of yellow, magenta, cyan and black.

(Fourth Embodiment)

Figure 21:
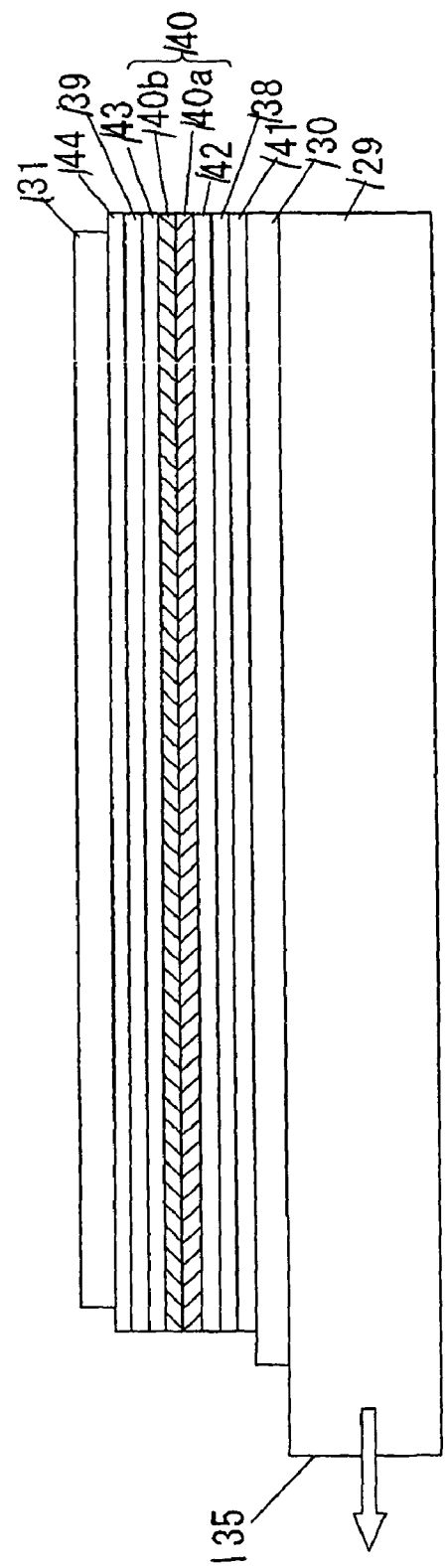
FIG. 21 is a cross-sectional view showing the organic electroluminescence element used as the light sources for the exposure part of the color image-forming apparatus for the fifth embodiment for practicing the invention.

FIG. 22 is a schematic view showing the configuration of a color image-forming apparatus in the fourth embodiment of practicing the invention. FIG. 21 is an explanatory drawing showing in detail the exposure part of the color image-forming apparatus depicted in FIG. 22. FIG. 22 is an explanatory drawing showing in detail the photoreception part of the color image-forming apparatus depicted in FIG. 22. FIG. 21 is an explanatory drawing showing in detail the development part of the color image-forming apparatus depicted in FIG. 22. FIG. 22 is a cross-sectional view showing the essential part of an organic electroluminescence element used as the light source of the exposure part depicted in FIG. 21. And, FIG. 21 is a cross-sectional view showing the essential part of another modified example of the organic electroluminescence element used as the light source of the exposure part depicted in FIG. 21.

In FIG. 22, the color image-forming apparatus 101 is provided with development parts 102, 103, 104 and 105 arranged sequentially each acting to form a color toner image of yellow (Y), magenta (M), cyan (C) or black (K), and further with exposure parts (exposure units) 106, 107, 108 and 109, and photoreception parts 110, 111, 112 and 113 each corresponding to each development part 102, 103, 104 or 105.

As is depicted in FIG. 21, the exposure parts 106 to 109 are equipped with head supporting members 106a, 107a, 108a and 109a, organic electroluminescence elements 106d, 107d, 108d and 109d each of which acts as a light source mounted on a support 106b, 107b, 108b or 109b and sealed air-tight with a sealing member 106c, 107c, 108c or 109c, and drivers 106e, 107e, 108e and 109e which are mounted on the supports 106b, 107b, 108b and 109b and supply voltage corresponding to image data to the organic electroluminescence elements 106d to 109d to cause the elements to emit light. Furthermore, on the substrates 106b, 107b, 108b and 109b, there are mounted prisms 106f, 107f, 108f and 109f which deflect the light emitted from the organic eletroluminescence elements 106d to 109d, fiber arrays 106g, 107g, 108g and 109g which collect the lights from the prisms 106f to 109f, and cylindrical lenses 106h, 107h, 108h and 109h which collect the light from the fiber arrays 106g to 109g to the sub-scanning direction.

As is depicted in FIG. 22 in detail, the photoreception parts 110 to 113 comprise photoreceptor drums (photoreceptors) 110a, 111a, 112a and 113a as rotatable image carriers, and chargers (charging means) 110b, 111b, 112b and 113b which are placed in pressed contact with the photoreceptor drums 110a to 113a and charge the surface of the photoreceptor drums 110a to 113a to a uniform potential, and cleaners 110c, 111c, 112c and 113c which remove the toner remaining on the photoreceptor drums 110a to 113a after image transfer.

The photoreceptor drums 110a to 113a which rotate in the circumferential direction are arranged in a line in such a manner that the rotating shafts are in parallel to each other. The chargers 110b to 113b in pressed contact with the photoreceptor drums 110a to 113a rotate along with the rotation of the photoreceptor drums 110a to 113a.

As is shown in detail in FIG. 21, the development parts 102 to 105 comprise development rollers (developing means) 102a, 103a, 104a and 105a which deposit toner on the photoreceptor drums 110a to 113a each bearing an electrostatic latent image on its outer surface by the action of the light emitted from the exposure parts 106 to 109 and convert the electrostatic latent images to visible ones, agitation members 102b, 103b, 104b and 105b which agitate toner 114 in tanks, supply rollers 102c, 103c, 104c and 105c which supply toner 114 to the development rollers 102a to 105a under agitation, and doctor blades 102d, 103d, 104d and 105d which adjust the layers of toner 114 supplied onto the development rollers 102a to 105a to a pre-determined thickness and charge toner 114 by friction.

As is shown in FIG. 22, at the positions facing these exposure parts 106 to 109, the photoreception parts 110 to 113 and the development parts 102 to 105, a transfer part 115 is arranged at which each toner image developed on one of the photoreceptor drums 110a to 113a is transferred onto a paper sheet (recording medium) P in superposition on each other to give a color toner image.

Each transfer part 115 is provided with a transfer roller 116, 117, 118 or 119 arranged to face each of the photoreceptor drums 110a to 113a, and spring 120, 121, 122 or 123 each of which presses each of the transfer rollers 116 to 119 onto each of the photoreceptor drums 110a to 113a In the opposite side of the transfer part 115, a paper-feeding part 124 which stocks paper sheets P is provided. And paper sheets P are taken out one by one from the paper-feeding part 124 by means of a paper-feeding roller 125.

On the paper transport path from the paper-feeding part 124 to the transfer part 115, a pair of registration rollers 126 is provided which feeds a paper sheet P to the transfer part 115 at a pre-determined timing. Further, on the paper transport path along which the paper sheet P runs holding the color toner images transferred at the transfer part 115, a fixing part 127 is formed. The fixing part 127 comprises a heating roller 127a and a pressure roller 127b in a pressed contact with the heating roller 127a. The color image transferred on the paper sheet P is fixed onto the paper sheet P by the pressure and heat generated during the nipping rotation with the rollers 127a and 127b.

In the image-forming apparatus of such configuration, first of all, an electrostatic latent image for the yellow color component of image information is formed on the photoreceptor drum 110a. This latent image is visualized into a yellow toner image on the photoreceptor drum 110a by means of the development roller 102a having the yellow toner. Meanwhile, the paper sheet P pulled out of the paper-feeding part 124 by means of the paper-feeding roller 125 is fed into the transfer part 115 in exact timing. Then, the sheet is nipped and conveyed by the photoreceptor drum 110a in conjunction with the transfer roller 116, and at this instant the above-described yellow toner image is transferred from the photoreceptor drum 110a.

During the transfer of the yellow toner image onto the paper sheet P, a latent image for the magenta color component is consequently formed, and is developed visible as a magenta toner image by means of the development roller 103a having the magenta toner. Then, on the paper sheet P onto which the yellow toner image has been transferred, the magenta toner image is transferred in superposed manner on the yellow toner image.

Further, in a similar way, image formation and transfer are conducted for cyan toner and black toner images, and superimposition of the four-color toner images completes on the paper sheet P.

Thereafter, the paper sheet P on which a color image has been formed is transported to the fixing part 127. In the fixing part 127, the transferred toner images are fixed onto the paper sheet P by heat, and a full-color image completes on the paper sheet P.

The paper sheet P, on which the series of color image-forming operations have thus finished, is then exhausted to a paper-exhausting tray 128.

In each of the organic electroluminescence elements 106b, 107b, 108b and 109b, which are light sources provided in the exposure parts 106 to 109, an anode 130 that comprises an electro-conductive transparent film formed by, for example, sputtering or resistive heating vapor deposition and acts as a hole injection electrode and a cathode 131 that is formed by, for example, resistive heating vapor deposition and acts as an electron injection electrode are provided.

Between the anode 130 and the cathode 131, alight-emitting layer 132 is provided. In FIG. 22, between the anode 130 and the light-emitting layer 132, a hole transport layer 133 is provided, and between the cathode 131 and the light-emitting layer 132, an electron transport layer 134 is provided.

When a current is applied to the organic electroluminescence element 106b to 109b having the structure shown in FIG. 22 by making the anode 130 a positive electrode and the cathode 131 a negative electrode, holes are injected into the light-emitting layer 132 from the anode 130 via the hole transport layer 133, and electrons are injected from the cathode 131 via the electron transport layer 134. In the light-emitting layer 132, the recombination of the hole and electron thus injected takes place, and the phenomenon of light emission takes place with the shift of an exciton generated by such recombination from the excited state to the ground state.

In an organic electroluminescence element of such structure, the light emitted from the luminescent material that is the light-emitting region in the light-emitting layer 132 radiates omni-directionally with the center of the luminescent material, and emerges through the waveguide 129. Alternatively, the light once proceeds in the direction opposite to the light emerging direction (the direction toward the waveguide 129), is reflected at the cathode 131, and emerges through the waveguide 129.

In an organic electroluminescence element such as depicted in FIG. 22, the light-emitting layer 132 of the element is preferably configured thicker than the anode 130 or the cathode 131.

Generally speaking, a short circuit occasionally occurs in an organic electroluminescence element due to a foreign matter present in the light-emitting layer 132. Alternatively, due to the level difference formed by the end of the anode 130 or cathode 131, the thickness of the light-emitting layer 132 becomes smaller than the pre-determined value. Thus, a short circuit sometimes occurs at the edge of the anode 130 or cathode 131. However, by configuring the element in the structure shown in FIG. 22, one can achieve an exposure unit that is less subject to short circuit between the anode 130 and cathode 131.

Next, individual parts and members composing the organic electroluminescence elements 106d to 109d will be described.

The waveguide 129 of the organic electroluminescence elements 106d to 109d in accordance with the invention comprises a transparent core 129a and a clad which has a refractive index smaller than that of core 129a and lies around core 129a (See FIG. 21.). But, since clad 129b can be substituted by an air layer, the waveguide may comprise only core 129a. By way of precaution, the definition of transparency or semi-transparency in the invention indicates such a degree of transparency as not to disturb the visual perception of the light emission by the organic electroluminescence element.

The material used for the waveguide can be appropriately chosen from inorganic glass including inorganic oxide glass such as, for example, transparent or semi-transparent soda-lime glass, barium and/or strontium-containing glass, lead glass, aluminosilicate glass, borosilicate glass, barium borosilicate glass and quartz glass, inorganic fluoride glass, high polymer glass such as transparent or semi-transparent poly (ethylene terephthalate), polycarbonate, poly(methyl methacrylate), poly(ether sulfone), poly(vinyl fluoride), polypropylene, polyethylene, acrylate polymer, amorphous polyolefin and fluorine-containing resin, chalcogenide glass such as transparent or semi-transparent $As_2S_3$, $As_{40}S_{10}$ and $S_{40}Ge_{10}$, metal oxide and nitride such as ZnO, $Nb_2O_5$, $Ta_2O_5$, SiO, $Si_3N_4$, $HfO_2$ and $TiO_2$, or else pigment-containing transparent substrate materials enumerated above. In addition, laminated substrates resulting from stacking a plurality of substrate materials may also be used. Further, a resist film can be used after bleaching. Still further, to make the refractive index of the waveguide close to that of the light-emitting layer, the waveguide can be composed of the same material as that of the light-emitting layer.

A light angle conversion structure is such that, when incident light reaches the boundary between two different media, the light is reflected at an angle different from the angle incident on the boundary, and comprises planes not parallel to any plane composing the substrate and a structure comprising such planes.

Specifically, the plane neither parallel nor vertical to the boundary is mentioned, and structures comprising such planes are exemplified by a triangular prism, a cylinder, a triangular pyramid and a cone, or composites or scattering planes in which these figures are arranged three- or two-dimensionally, also by a waveguide curvature, concavities and convexities in a waveguide surface, a micro lens, a micro prism and a micro mirror structure, and the assemblages of these.

For confirmation, the light angle conversion structure may be provided on the surface or inside of a waveguide.

In the case where a light angle conversion structure is provided on the waveguide surface, concavities and convexities can be formed on the waveguide surface by grinding the waveguide surface, and on the concavities and convexities, a clad or light-emitting element can be formed. An angle conversion structure can also be achieved by bonding micro lenses on the waveguide surface. In the case where a light angle conversion structure is provided on the waveguide surface, the boundary surface may be the air/substrate interface whereby the air is used as a clad layer. In this way, by processing the waveguide surface after the fabrication of an organic electroluminescence element, a light angle conversion structure can be formed. Thus, due to the simplicity of the production procedure, the structure can be formed rather easily.

In the case where a light angle conversion structure is provided inside of the waveguide, concavities and convexities or micro lenses are involved in the waveguide. Thus, the structure can be formed in the core or clad, or at the core/clad interface. When the structure is formed at the core/clad interface, concavities and convexities are formed on the core surface by grinding, blasting or etching, and then a clad layer is formed on the processed surface, thus achieving a angle conversion structure. Since the light angle conversion structure is not naked in such configuration, light angle conversion is stably conducted. Further, since the waveguide surface can be made flat, an anode and the like can be fabricated on the waveguide surface with ease.

Still further, depending on the application, such materials as to transmit light only in a specified wavelength region or have a light-to-light conversion capability and convert impinging light to the one with a specified wavelength may be used. Alternatively, the waveguide may include a plurality of waveguide paths optically isolated from each other are arranged for each pixel in parallelism to each other in the main scanning direction. Moreover, by configuring the core portion of the waveguide to be electrically conductive and the clad to be insulating, one can use a plurality of electrically separated core portions as anodes or cathodes.

In the present embodiment, the waveguide 129 form waveguide paths optically isolated from each other and arranged for each pixel in parallelism to each other in the main scanning direction. The substrate 129 comprises a core 129a having a specified refractive index and a clad 129b formed around the external periphery of the core 129a and having a refractive index smaller than that of the core. The clad 129b may be provided on the entire external periphery of the core 129a or on part of the outer periphery.

The refractive index of the core 129a can be set smaller than that of the light-emitting layer, or larger than the value obtained by subtracting 0.3 from the refractive index of the light-emitting layer.

In the present embodiment, the waveguide 129 consists of waveguide paths with a pitch of about 10.5 μm, and is configured so as to correspond to the resolution of 2400 dpi in the main scanning direction whereby an arbitrary cross-sectional shape is allowed so long as it can form a specified latent image on a photoreceptor. Hence, depending on the printing conditions such as resolution and the revolution of the photoreceptor, the pitch as well as the cross-sectional shape can be designed appropriately.

Though the configuration in which the waveguide is used as the substrate was described in the present embodiment, another configuration in which the organic electroluminescence element and the waveguide are fabricated separately whereby the organic electroluminescence element and the waveguide are bonded with an optical adhesive. When an air layer lies between the organic electroluminescence element and the waveguide in such a configuration, the quantity of light propagating through the waveguide decreases due to total reflection, and an efficient light propagation is not achieved. Accordingly, it is desirable to bond the organic electroluminescence element and the waveguide in such a manner as to exclude an air layer therebetween, when the two components are fabricated separately.

As the substrate for the organic electroluminescence element in accordance with the invention, a transparent or semi-transparent material may be used; in cases where light is taken out not through the substrate, an opaque material may also be used. Any of these materials can be used so long as it has a sufficient strength for holding the organic electroluminescence element. The substrate can be appropriately selected from the transparent substrate materials equivalent to the above-enumerated ones for the waveguide. Further, the substrate can be fabricated by appropriately selecting from semiconductors such as opaque silicon, germanium, silicon carbide, gallium arsenide and gallium nitride, pigment-containing transparent substrate materials mentioned above, metal material which surface has been subjected to insulation treatment, and plastic materials. In addition, laminated substrates resulting from stacking a plurality of substrate materials may also be used.

As for the resistivity of the substrate, though the substrate is preferably an insulator, there is no specific restriction, and the substrate should have a resistivity in the range not to impede the driving of the organic electroluminescence element. In certain applications, the substrate may be electrically conductive.

Further, on the surface of or within such a substrate, a circuit may be fabricated that comprises, for example, a resistor, condenser, inductor, diode or transistor and serves to drive the organic electroluminescence element.

As the anode 130 of the organic electroluminescence elements 106d to 109d, metal oxides such as indium tin oxide (ITO), tin oxide ($SnO_2$) and zinc oxide (ZnO); transparent conductive films comprising a mixture such as Sno:Sb (antimony), ZnO:Al (aluminum) and IZO ($In_2O_3$:ZnO); metal films having such a thickness as not to deteriorate transparency such as Al (aluminum), Cu (copper), Ti (titanium), Ag (silver) and Au (gold); metal films made of a mixture of these metals, films made by stacking these metals; or conductive polymeric materials such as polypyrrole can be used. Further, a transparent electrode can be prepared by stacking a plurality of the above-mentioned materials for transparent electrode. Methods of fabrication include resistive heating vapor deposition, electron beam vapor deposition, sputtering and various polymerization methods such as electric field polymerization. In order to have a sufficient conductivity or prevent an uneven light emission caused by the unevenness of the substrate surface, the transparent electrode preferably has a thickness of 1 nm or more. And, to secure a sufficient transparency, the thickness preferably does not exceed 500 nm.

Moreover, as the anode, in addition to the materials for transparent electrode cited previously, metals having a large work function such as Cr (chromium), Ni (nickel), Cu (copper), Sn (tin), W (tungsten) and Au (gold), alloys and oxides of these metals can be used. Stacked structures comprising a plurality of the anode materials cited above can also be adopted. However, in the case of not using a transparent electrode for the anode, the anode is preferably fabricated with a material that reflects light to utilize the effect of the light angle conversion member at maximum. In the case of not using a transparent electrode for the anode, it suffices to make the cathode a transparent electrode.

As the light-emitting layers 132 of the organic electroluminescence elements 106d to 109d, materials which have a luminescent property in the visible region and exhibit a good film-forming property are preferred including, in addition to $Alq_3$ and Be-benzoquinolinol ($BeBq_2$), benzoxazole-based fluorescent brightening agents such as 2,5-bis(5,7-di-t-pentyl-2-benzoxazolyl)-1,3,4-thiadiazole, 4,4'-bis(5,7-pentyl-2-benzoxazolyl)stilbene, 2,5-bis(5,7-di(2-methyl-2-butyl)-2-benzoxazolyl) stilbene, 4,4'-bis(5,7-di-t-pentyl-2-benzoxazolyl))thiophine, 2,5-bis([5-α,α-dimethylbenzyl]-2-benzoxazolyl) thiophene, 2,5-bis[5,7-di-(2-methyl-2-butyl)-2-benzoxazolyl]-3,4-diph enylthiophene, 2,5-bis(5-methyl-2-benzoxazolyl)thiophene, 4,4'-bis(2-benzoxazolyl) biphenyl, 5-methyl-2-[2-[4-(5-methyl-2-benzoxazolyl) phenyl]vinyl]ben zoxazolyl and 2-[2-(4-chlorophenyl)vinyl] naphtho[1,2-d]oxazole; benzothiazole-based fluorescent brightening agents such as 2,2'-(p-phenylenedivinylene)-bis-benzothiazole, benzimidazole-based fluorescent brightening agents such as 2-[2-[4-(2-benzimidazolyl)phenyl]vinyl]benzimidazole and 2-[2-[4-carboxyphenyl]vinyl] benzimidazole; 8-hydroxyquinoline-based metal complexes such as magnesium bis(8-quinolinol), zinc bis(benzo-8-quinolinol), aluminum oxide bis(2-methyl-8-quinolinolate), indium tris(8-quinolinol), aluminum tris(5-methyl-8-quinolinol), lithium 8-quinolinol, gallium tris(5-chloro-8-quinolinol), calcium bis(5-chloro-8-quinolinol) and poly[zinc-bis (8-hydroxy-5-quinolinonyl)methane]; metal chelate oxynoid compounds such as dilithium epindolidione; styryl-benzene-based compounds such as 1,4-bis(2-methylstyryl) benzene, 1,4-(3-methylstyryl)benzene, 1,4-bis(4-methylstyryl)benzene, distyrylbenzene, 1,4-bis(2-ethylstyryl) benzene, 1,4-bis(3-ethylstyryl)benzene and 1,4-bis(2-methylstyryl)2-methylbenzene; distyryl pyrazine derivatives such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis[2-(1-pyrenyl)vinyl]pyrazine; naphthalimide derivatives, perylene derivatives, oxadiazole derivatives, aldazine derivatives, cyclopentadiene derivatives, styrylamine derivatives, coumarine derivatives, and aromatic dimethylidyne derivatives. Moreover, anthracene, salicylic acid salt, pyrene and coronene can be used. Alternatively, phosphorescent light-emitting materials such as iridium fac-tris(2-phenylpyridine) or polymeric light-emitting materials such as PPV (poly(p-phenylenevinylene)), polyfluorene may also be used.

In addition to a monolayer structure consisting of a light-emitting layer, a double-layer structure consisting of a hole transport layer coupled with a light-emitting layer or a light-emitting layer coupled with an electron transport layer, and a tri-layer structure consisting of a hole transport layer, a light-emitting layer and an electron transport layer are all available. However, in the cases of double- or tri-layer structures, the element is configured by stacking so that the hole transport layer contacts with the anode or the electron transport layer with the cathode. Alternatively, a structure in which an electron blocking layer is formed between a hole transport layer and a light-emitting layer, one in which a hole blocking layer is formed between a light-emitting layer and an electron transport layer, one in which a hole injection layer is formed between an anode and a hole transport layer, and one in which an electron transport layer is formed between an electron injection layer and a cathode, or further multi-layer structures in which function-separated layers are appropriately stacked or fabricated in mixed layers can be used.

As the hole transport layer 133, materials which exhibit a large hole mobility, is transparent and have a good film-forming property are preferred. Various organic materials including the following ones can be used in addition to TPD; porphyrin compounds such as porphine, copper tetraphenylporphine, phthalocyanine, copper phthalocyanine and titanium phthalocyanine oxide; aromatic tertiary amines such as 1,1-bis{4-(di-p-tolylamino)phenyl}cyclohexane, 4,4',4''-trimethyltriphenylamine, N,N,N',N'-tetraquis(p-tolyl)-p-phenylenediamine, 1-(N,N-di-p-tolylamino)naphthalene, 4,4'-bis(dimethylamino)-2,2'-dimethyltriphenylmethane, N,N,N',N'-tetraphenyl-4,4'-diaminobiphenyl, N,N'-diphenyl-N,N'-di-m-tolyl-4,N,N-diphenyl-N,N'-bis(3-me thylphenyl)-1,1'-4,4'-diamine, 4'-diaminobiphenyl and N-phenylcarbazole; stilbene compounds such as 4-di-p-tolylaminostilbene and 4-(di-p-tolylamino)-4'-[4-(di-p-tolylamino)styryl]stilbene triazole derivatives, oxadiazazole derivatives, imidazole derivatives, polyarylalkane derivatives, pyrazoline derivatives, pyrazolone derivatives, phenylenediamine derivatives, anilamine derivatives, amino-substituted chalcone derivatives, oxazole derivatives, styrylanthracene derivatives, fluorenone derivatives, hydrazone derivatives, silazane derivatives, polysilane- and aniline-based copolymers, oligomers, styrylamine compounds, aromatic dimethylidyne-based compounds and poly (3-methylthiophene). Also, a polymer dispersion-type hole transport layer can be used in which a low molecular weight organic material used for hole transport layers is dispersed in a high polymer material such as polycarbonate. These hole transport materials can be used as hole injection materials or electron blocking materials.

As the electron transport layer 134, oxadiazole derivatives such as 1,3-bis(4-tert-butylphenyl-1,3,4-oxadiazolyl)phenylene (OXD-7), anthraquinodimethane derivatives, diphenylquinone derivatives, PEDOT (polyethylene dioxythiophene), BAlq and BCP (basovproin) can be used. These electron transport materials can be used as electron injection materials or hole blocking materials too.

As the cathode 31 for the organic electroluminescence elements 106d to 109d, metals or alloys with a low work function are used including metals such as Al, In, Mg and Ti, magnesium alloys such as Mg—Ag alloys and Mg—In alloys, aluminum alloys such as Al—Li alloys, Al—Sr alloys and Al—Ba alloys. In addition, stacked structures such as $LiO_2$/Al and LiF/Al are suited as cathode materials.

A transparent cathode can be fabricated by forming a ultra-thin film with high light transparency using a metal with a small work function, and then overlaying a transparent electrode on the film.

For the fabrication of such cathode, resistive heat vapor deposition, electron beam vapor deposition and sputtering are adopted.

As has been stated previously, in the organic electroluminescence elements 106d to 109d, the light emitted from the light-emitting layer is radiated through the opposite surface of the waveguide. When the light reaches the boundary between each medium, if the refractive index of the medium lying in the incident side is larger than that of the medium lying in the emerging side, the light incident at an angle larger than the critical angle at which the emerging angle of the refracted wave becomes 90° cannot pass the boundary but is to totally reflected at the boundary between the media.

Accordingly, in the organic electroluminescence elements 106d to 109d in which light is emitted isotropically, the light emitted at an angle larger than this critical angle advances in the waveguide to the edge in the sub-scanning direction by repeating total reflection at the boundary plane of the waveguide; particularly in the configuration of the present embodiment, the light advances in the core 129a surrounded by the clad 129b of the waveguide 129 by repeating total reflection as shown in FIG. 22.

Thus, in the present embodiment, by taking notice of this fact, the edge plane of the waveguide 129 in the sub-scanning direction is configured as a light emerging plane 135, and the light emerging from this light emerging plane 135 is used as the exposure light.

In this structure, with the increase of the area of the light-emitting layer, the light quantity proceeding in the core 129a increases. Thus, the light quantity reaching the light emerging plane 135 that is the edge plane of the waveguide 129 in the sub-scanning direction increases. This means that, since the exposure light quantity increases only by increasing the area of the light-emitting layer in the case where the light from the light emerging plane 135, which is the edge plane of the waveguide 129 in the sub-scanning direction, is used as the exposure light, the level of emitting light quantity required for image exposure is achieved without shortening the life of the organic electroluminescence element by increasing the applied current.

In short, the invention uses the light from the light emerging plane 135 that is the edge plane of the waveguide 129. In the present embodiment, the substrate and the waveguide are unified as mentioned above. However, the waveguide may be fabricated independent of the substrate.

With use of an image-forming apparatus equipped with such exposure unit, electrostatic latent images can be adequately formed on the photoreceptor drums 110*a* to 113*a*, leading to high quality image formation.

In particular, because the waveguide 129 that acts to guide light comprises a core 129*a* and a clad 129*b* in the present embodiment, the light emitted from the light-emitting layer is efficiently conducted to the light emerging plane 135, the emitted light quantity further increases. However, the structure of the waveguide is not restricted to the double-layer one of a core 129*a* and a clad 129*b*.

In the double-layer structure, between the adjacent cores 129*a*, a light-shielding layer or light reflection layer may be provided. By the provision of the light-shielding layer or light reflection layer, a core 129*a* in concern does not receive light from another core 129*a*. Accordingly, the fluctuation among cores 129*a* of the light quantity emergent from the light emerging plane 135 diminishes. Particularly when a reflection layer is provided, a larger quantity of light reaches the light emerging plane 135 owing to an enhanced reflection of the light impinging in the core 129*a* from the light-emitting layer, leading to an increase of light quantity.

Though the light emerging plane 135 can be fabricated so as to have a rectangular or hexagonal shape, it is preferred to fabricate it into the shape corresponding to that of the pixel. By way of precaution, when the waveguide 129 comprises a core 129*a* and a clad 129*b*, light emerging plane 135 is a plane composed of the core 129*a* and the clad 129*b*.

As is shown in FIG. 21, in the waveguide an angle conversion part 136 can be provided which converts the angle of light impinging on the waveguide 129 from the light-emitting layer 132 to direct light to the light emerging plane 135. By providing such an angle conversion part 136, the quantity of light emerging from the light emerging plane 135 can be further enhanced. In the case depicted in the figure, angle conversion part 136 is a light-scattering surface which comprises a large number of semi-spherical bodies arranged in the plane of the waveguide 129 opposite to the light-emitting layer 132. Instead of this light-scattering surface, a concavo-convex surface, a hog-backed or saw-tooth concavo-convex surface uniformly extending in the main scanning direction, or still other ones with various surface shapes may also be adopted. Then, by providing an angle conversion part 136 that consists of a one-dimensional profile aligned in parallel in a large number, angle conversion for a specified angle can be achieved. To make sure, it is desirable that the angle conversion part 36 does not accompany any angle conversion toward the main scanning direction for the purpose of conducting the light directed in the directions other than the sub-scanning direction to the light emerging plane 135. In particular, it is effective to provide an angle conversion part 136 that performs angle conversion for the direction (one normal to the light-emitting layer plane) perpendicular to both of the main and sub-scanning directions, since the light that would be lost if such angle conversion part is not provided is conducted to the light emerging plane 135 without disturbing the propagation of light in the sub-scanning direction. Additionally, in the case where the waveguide 129 comprises a core 129*a* and a clad 129*b*, angle conversion by the angle conversion part 136 is achieved along with an effective use of the total reflection effect at the interface between the core 129*a* and the clad 129*b* by forming the angle conversion part 136 at the interface between the core 129*a* and the clad 129*b* lying opposite to the light-emitting layer 132.

Further, in waveguide 129, a reflection layer can be provided in the planes facing the light emerging plane 135 and lying opposite to the light-emitting layer 132. Since, by the provision of a reflection layer, a larger portion of the light impinging on the waveguide 129 from the light-emitting layer 132 is reflected and reaches the light emerging plane 135, an increase of light quantity can be achieved. For confirmation, the reflection layer may be provided only either the plane facing the light emerging plane 135 or the one lying opposite to the light-emitting layer 132.

Still further, in the light emerging plane 135 of the waveguide 129, a diffusion-suppressing member 137 can be provided that makes the diffusion angle of the light emerging from the light emerging plane 135 narrow or parallel. As the diffusion-suppressing member 137 to be provided, in addition to curved surface lenses such as concave and convex lenses, a ion-doped type lens, a slit-shaped UV-converted lens, a mesa structure utilizing total reflection as shown in FIG. 22, and a tapered reflection structure in which a mirror plane is arranged at the position equivalent to the total reflection plane of the mesa structure are mentioned. A lens may be allotted to each light emerging plane 135, or plural lenses may be provided per one light emerging plane 135. Alternatively, one lens may be allotted to plural light emerging planes 135, or a cylindrical lens or one-dimensional mesa structure may be provided for all of the light emerging planes. All of these structures based on unified lens(es) can suppress light diffusion.

In the case where the light emerging plane 135 of the waveguide 129 is arranged at a position very close to each of the photoreceptor drums 110*a* to 113*a*, specifically within a distance not exceeding the diagonal length of a pixel, the light emerging from the light emerging plane 135 is directly irradiated on the photoreceptor drum not through one of image transmission optics 106*f* to 109*f*. In the case where the light emerging plane 135 is arranged at a position apart from each of the photoreceptor drums 110*a* to 113*a*, the light is focused on the drum (110*a* to 113*a*) as an erect, actual size image.

Though the above explanation has been made for the case where the invention is applied to a color image-forming apparatus, the invention can be applied to a monochromatic, for example, black image-forming apparatus. In cases where the invention is applied to a color image-forming apparatus, the developing colors are not restricted to the four colors of yellow, magenta, cyan and black.

(Fifth Embodiment)

FIG. 21 is a cross-sectional view showing the essential part of an organic electroluminescence element used as the exposure light source for the color image-forming apparatus in the fifth embodiment for practicing the invention. For confirmation, in the present embodiment, the configuration and the details of the color image-forming apparatus are the same as depicted in FIGS. 10 to 13 used in the fourth embodiment.

Between an anode 130 and a cathode 131 in FIG. 21, a first light-emitting layer 138 having a light-emitting region and lying at the anode (130) side (close to the anode 130) and a second light-emitting layer 139 having a light-emitting region and lying at the cathode (131) side (close to the cathode 131) are provided.

Further, between the first light-emitting layer 139 and the second light-emitting layer 139 lying close to the cathode 131, charge generation layers 140 which inject electrons into the first light-emitting layer and inject holes into the second light-emitting layer 139 are formed.

Still further, between the anode 130 and the first light-emitting layer 138, a first hole transport layer 141 is formed;

between the first light-emitting layer 138 and the charge generation layer 140, a first electron transport layer 142 is formed; between the charge generation layer 140 and the second light-emitting layer 139, a second hole transport layer 143 is formed; and between the second light-emitting layer 139 and the cathode 131, a second electron transport layer 144 is formed.

When an electric current is applied to the organic electroluminescence elements having the configuration depicted in FIG. 21 by making the anode 130 a positive electrode and the cathode 131 a negative electrode, the first light-emitting layer 138 is injected holes from the anode 130 via the first hole transport layer 141 along with electron injection from the charge generation layer 140 via the first electron transport layer 142, and the second light-emitting layer 139 is injected electrons from the cathode 131 via the second electron transport layer 144 along with hole injection from the charge generation layer 140 via the second hole transport layer 143. In the first and second light-emitting layers 138 and 139, recombination of the hole and electron thus injected takes place; and when an exciton generated by such recombination shifts from the excited state to the ground state, the phenomenon of light emission takes place.

Since light emission takes place in the plural light-emitting layers of the first one 138 and the second one 139, the light quantity emitted from the organic electroluminescence element can be increased.

As the charge generation layer 140 of the organic electroluminescence element, materials that are transparent to the light emitted from the light-emitting layer and capable of efficiently injecting hole-electron pairs, including, for example, metal oxides such as ITO (indium-tin oxide), $V_2O_5$ (vanadium oxide), organic materials such as 4F-TCNQ (tetrafluorotetracyanoquinodimethane) as set forth in the Proceedings of 63rd Annual Autumn Meeting of the Japan Society of Applied Physics, 27a-ZL-12. In addition to those, various materials such as conductor, semiconductor, dielectric and insulator, and a stacked film resulting from stacking plural materials can be used for the charge generation layer 140.

In an organic electroluminescence element having a structure described heretofore, the work function of the charge generation layer 140 is set higher than the ionization potential of the first light-emitting layer 138 close to the anode 130. In addition, when the charge generation layer 140 is made of a conductor, the work function of the charge generation layer 140 is set higher than the ionization potential of the second light-emitting layer 139 lying close to the cathode 131. Alternatively, when the charge generation layer 140 is made of a semiconductor, dielectric or insulator, it is desirable to set the electron affinity of the charge generation layer 140 lower than the electron affinity of the first light-emitting layer 138 lying close to the anode 130, and the ionization potential of the charge generation layer 140 higher than the ionization potential of the second light-emitting layer 139.

Such setting is due to the following mechanism. When the electron affinity of the charge generation layer 140 is lower than the electron affinity of the first light-emitting layer 138 lying close to anode 130, the efficiency of electron injection from the charge generation layer 140 to the first light-emitting layer 138 lying close to the anode 130 is enhanced, and when the work function of the charge generation layer 140 is higher than the ionization potential of the second light-emitting layer 139 lying close to the cathode 131, or when the ionization potential of the charge generation layer 140 is higher than the ionization potential of the second light-emitting layer 139 lying close to the cathode 131, the efficiency of hole injection from the charge generation layer 140 to the second light-emitting layer 139 lying close to the cathode 131 is enhanced. Accordingly, the quantity of light emitted from the first light-emitting layer 138 lying close to the anode 130 and the second light-emitting layer 139 lying close to the cathode 131 increases, resulting in a further increase of the emitted light quantity of the organic electroluminescence element.

By way of precaution, in the case where the charge generation layer 140 is made of an inorganic material, it is ordinary that the ionization potential of the second light-emitting layer 139 is higher than that of the charge generation layer 140. Under such condition, the efficiency of hole injection from the charge generation layer 140 to the second light-emitting layer 139 can be made high without deterioration by making the potential difference between the two layers as small as possible, specifically, for example, 0.6 eV or smaller, even if the ionization potential of the charge generation layer is lower than that of the second light-emitting layer. In addition, the efficiency of hole and electron injections to each light emission layer can increase, for example, by making the potential difference between the electron affinity of the first light-emitting layer 138 close to the anode 130 and the electron affinity of the charge generation layer 140, such that the potential difference between the ionization potential of the second light emitting-layer 139 close to the cathode 131 and the ionization potential of the charge generation layer 140, are both configured to be 0.6 eV or less.

And, by adopting such an organic electroluminescence element as the light source for an exposure part, it is possible to attain the level of light quantity required for image exposure without making the apparatus bulky.

Moreover, by using such an exposure part in an image-forming apparatus, a compact image-forming apparatus can be obtained.

By way of precaution, as shown in FIG. 21, the charge generation layer 140 can take a double-layer structure comprising the first charge generation layer 140a arranged close to the first light-emitting layer 134 which lies close to the anode, and a second generation layer 140b arranged close to the second light-emitting layer 139 which lies close to the cathode, or a multi-layer structure comprising still more layers.

In such multi-layer structures, it is preferred to set the electron affinity of the first generation layer 140a lower than that of the second charge generation layer 140b, and the ionization potential of the second charge generation layer 140b higher than that of the first charge generation layer 140a.

Further, the layer which is first fabricated into the form of film (either the first charge generation layer 140a or the second one 140b) is preferably produced by resistive heating, in order to reduce the damaging of the first light-emitting layer 138 during the film-forming step for forming, for example, the first charge generation layer 40a on the first light-emitting layer 138 lying close to the anode. The charge generation layer to be provided thereafter can be fabricated even by sputtering, plasma CVD, ion beam or electron beam deposition all of which may cause damaging during film formation.

In the case where a dielectric material is used for the charge generation layer 140, it is preferred to set the relative permittivity of the charge generation layer 140 larger than those of the first light-emitting layer 138 lying close to the anode and of the second light-emitting layer 139 lying close to the cathode. For example, it is preferred that the relative permittivity of the charge generation layer 138 is set at roughly 8 to 10 or higher while the relative permittivity of the first light-emitting layer 138 lying close to the anode and that of the second light-emitting layer 139 lying close to the cathode are set at about 3.

Among the light-emitting layers, the hole transport layers and the electron transport layers arranged between the first fabricated electrode (either the anode 130 or the cathode 131) and the charge generation layer 140 (i.e., the first light-emitting layer 138, the first hole transport layer 141 and the first electron transport layer 142 when the anode 130 is first fabricated; and the second light-emitting layer 139 lying close to the cathode, the second hole transport layer 143 and the second electron transport layer 144 when the cathode 134 is first fabricated), the one adjacent to charge generation layer 140, in other words, the one adjacent to the charge generation layer 140 among the layers including the light-emitting ones, should preferably be made of a high polymer material since it is less subject to damaging during the formation of the charge generation layer 140. In the cases of a monolayer structure consisting of a light-emitting layer, a double-layer structure consisting of a light-emitting layer and an electron transport layer, a double-layer structure consisting of a hole transport layer and a light-emitting layer, or a multi-layer structure consisting of various functional layers such as hole transport, hole injection, electron blocking, and electron injection layers, the layer adjacent to the charge generation layer 140 among these layers is made of a high polymer material.

By way of precaution, the first light-emitting layer 138 lying close to the anode and the second light-emitting layer 139 lying close to the cathode may be formulated with the same material or different ones.

In the description hereinabove, the organic electroluminescence element as the exposure light source is driven by dc; however, it may be driven by ac voltage or ac current, or further by wave pulse, too.

Though the above explanation has been made for the case where the invention is applied to a color image-forming apparatus, the invention can be applied to a monochromatic, for example, black image-forming apparatus. In cases where the invention is applied to a color image-forming apparatus, the developing colors are not restricted to the four colors of yellow, magenta, cyan and black.

(Sixth Embodiment)

FIG. 22 is a cross-sectional view showing the essential part of an organic electroluminescence element used as the exposure light source for the color image-forming apparatus in the sixth embodiment for practicing the invention. For confirmation, in the present embodiment, the configuration and the details of the color image-forming apparatus are the same as shown in FIGS. 10 to 13 used in the fourth embodiment.

The organic electroluminescence element as the light source for exposure shown in the figure consists of an anode 130, a first hole transport layer 145, a first light-emitting layer 146, a first electron transport layer 147, a cathode 131, an insulating layer 148, another anode 130, a second hole transport layer 149, a second light-emitting layer 105, a second electron transport layer 151 and a cathode 131 stacked in turn on a waveguide 129. In other words, the element has the configuration of alternately arranged anodes 130 and cathodes 131 with an intervening light-emitting layer 146 (150), a hole transport layer 145 (149) and an electron transport layer 147 (151).

By way of precaution, all the anodes and cathodes need not sandwich a light-emitting layer, for example, as shown in FIG. 21 of the second embodiment, but, as is exemplified by the relation of the anode 130 to the cathode 131 both as intermediate layers as shown in FIG. 22 of the third embodiment, may sandwich a layer other than a light-emitting layer such as insulating layer 148.

When a dc voltage or dc current is applied to the organic electroluminescence elements of such configuration by making the two anodes 130 positive electrodes and the two cathodes 131 negative electrodes, the first light-emitting layer 146 is injected holes from the anode 130 lying close to the waveguide 129 via the first hole transport layer 146 along with electron injection from the cathode 131 lying close to the insulating layer 148 via the first electron transport layer 147, and the second light-emitting layer 150 is injected electrons from the top cathode 131 via the second electron transport layer 151 along with hole injection from the anode 130 lying close to the insulating layer 148 via the second hole transport layer 149. In the first and second light-emitting layers 146 and 150, recombination of the hole and electron thus injected takes place; and when an exciton generated by such recombination shifts from the excited state to the ground state, the phenomenon of light emission takes place.

Again with such a configuration, light emission takes place in the plural light-emitting layers of the first and second light-emitting layers 146 and 150, leading to an increased quantity of light emitted by the organic electroluminescence element.

By way of precaution, between the anode 130 and the cathode 31, the insulating layer 148 need not always be sandwiched. In such a case, the anode 130 and the cathode 131 both sandwiched by the first light-emitting layer 146 and the second light-emitting layer 150 are unified to a common electrode that acts as a cathode injecting electrons into the first light-emitting layer 146, and also as an anode injecting holes into the second light-emitting layer 148, and a configuration is adopted consisting of a second hole transport layer 149, a second light-emitting layer 150, a second electron transport layer 151 and a cathode 131 stacked in this order. Alternatively, the anode 130 and cathode 131 both sandwiched between the first light-emitting layer 146 and the second light-emitting layer 150 is made a common electrode, and a configuration is adopted consisting of a second electron transport layer 151, a second light-emitting layer 150, a second hole transport layer 149 and an anode 130 stacked in this order.

Again in the present embodiment, each of the individual organic thin film unit has a tri-layer structure consisting of a hole transport layer 145 (149), a light-emitting layer 146 (150) and an electron transport layer 147 (151). But, in addition to such a structure, the organic thin film unit may have a monolayer structure of a light-emitting layer alone or a double-layer structure of a hole transport layer coupled with a light-emitting layer or a light-emitting layer coupled with an electron transport layer. However, in the case of such double- or tri-layer structure, the structure is obtained with a stacking order so that the hole transport layer contacts with the anode or the electron transport layer contacts with the cathode. Alternatively, a structure in which an electron blocking layer is formed between a hole transport layer and a light-emitting layer, one in which a hole blocking layer is formed between a light-emitting layer and an electron transport layer, one in which a hole injection layer is formed between an anode and a hole transport layer, and one in which an electron injection layer is formed between an electron transport layer and a cathode, or further multi-layer structures in which function-separated layers are appropriately stacked or fabricated in mixed layers can be used.

Further, though in the illustrated case, two anodes 130 and two cathodes 131 are arranged alternately to each other, at least one anode and one cathode suffice, and either of the anode 130 or the cathode 131 may be arranged in continuum with an intervening insulating layer 148.

In the present embodiment, the light-emitting layers and hole transport layers arranged between the first fabricated electrode and the subsequently fabricated one are preferably formulated with high polymer material which is less subject to damaging. In a monolayer structure of a light-emitting layer, a double-layer structure consisting of a light-emitting layer and an electron transport layer, and a tri-layer structure consisting of a hole transport layer, a light-emitting layer and an electron transport layer, any layer of these is preferably made of high polymer materials.

In the description hereinabove, the organic electroluminescence element as the exposure light source is driven by dc; however, it may be driven by ac voltage or ac current, or further by wave pulse, too.

Though the above explanation has been made for the case where the invention is applied to a color image-forming apparatus, the invention can be applied to a monochromatic, for example, black image-forming apparatus. In cases where the invention is applied to a color image-forming apparatus, the developing colors are not restricted to the four colors of yellow, magenta, cyan and black.

The organic electroluminescence element in accordance with the invention, the exposure unit and the image-forming apparatus both using the element can be applied to the uses such as organic electroluminescence elements used as light-emitting elements in various apparatuses which require to enhance the light quantity emitted by the organic electroluminescence element, exposure units and image-forming apparatuses both using the element.

As has been described hereinabove, according to the invention, in an exposure unit using the light which is emitted from the light-emitting layer of an organic electroluminescence element and irradiates from the light emerging plane composing the edge plane of a waveguide in the sub-scanning direction, the thickness of the light-emitting layer can easily be made large. Accordingly, a practically useful effect is attained that an exposure unit can be fabricated which is less subject to short circuit caused by the contamination of foreign matters or an electrode level difference even when the area of the light-emitting layer is large, exhibits a high yield of the exposure unit production and excels in a long term operation stability.

Moreover, by adopting a configuration in which light emission takes place in a plurality of light-emitting layers, another useful effect is attained that an exposure unit can be fabricated in which the light quantity emitted by the organic electroluminescence element is large, exhibits a high yield of the exposure unit production and excels in a long term operation stability.

The present disclosure relates to subject matter contained in priority Japanese Patent Application Nos. 2002-274534, filed on Sep. 20, 2002, 2003-194211, filed on Jul. 9, 2003, and 2003-321368, filed on Sep. 12, 2003, the contents of all are herein expressly incorporated by reference in their entireties.

What is claimed is:

1. An organic electroluminescence element comprising, on a substrate:
   an anode which acts as a hole injection electrode;
   a cathode which acts as an electron injection electrode;
   a plurality of light emission layers each having a light emission region; and
   a charge generation layer which injects electrons into a light emission layer arranged close to said anode and holes into a light emission layer arranged close to said cathode, and said light emission layers and said charge generation layer being arranged between said anode and said cathode;
   wherein the work function of said charge generation layer is configured higher than the ionization potential of said light emission layer arranged close to said anode.

2. An organic electroluminescence element set forth in claim 1, in which said charge generation layer comprises at least a first generation layer lying in the side of the light emission layer arranged close to said anode and a second generation layer lying in the side of the light emission layer arranged close to said cathode,
   wherein said first generation layer is configured at a lower electron affinity compared to that of said second generation layer, and said second generation layer is configured at a higher ionization potential compared to that of said first generation layer.

3. An organic electroluminescence element set forth in claim 2, wherein the generation layer which is first fabricated is prepared by resistive heating.

4. An organic electroluminescence element set forth in claim 1, wherein said charge generation layer is made of a dielectric material and the relative permittivity of said charge generation layer is larger than that of said light emission layer.

5. An organic electroluminescence element set forth in claim 1, wherein the light emission layer arranged close to said anode and the light emission layer arranged close to said cathode are made of the same material mutually.

6. An organic electroluminescence element set forth in claim 1, wherein any of organic thin film layers constituted by the light emission layer or a hole transport layer or an electron transport layer which is formed on the light emission layer if necessary, and provided in contact with the charge generation layer on the substrate side is formed by a polymer material.

7. A organic electroluminescence element according to claim 1, wherein all organic thin film layers constituted by the light emission layer or a hole transport layer or an electron transport layer which is provided on the light emission layer if necessary are formed by a polymer material.

8. An organic electroluminescence element set forth in claim 1, wherein said charge generation layer comprises a high polymer-based organic film.

9. An organic electroluminescence element set forth in claim 1, wherein the organic thin film layer and the charge generation layer are fabricated by a film-forming method based on a wet process.

10. An organic electroluminescence element set forth in claim 1, wherein the drying temperature for the organic thin film layer arranged close to said cathode is one not exceeding the glass transition temperature of the light emission layer arranged close to said anode.

11. An exposure unit which uses the organic electroluminescence element set forth in claim 1 as the light source.

12. An organic electroluminescence element comprising, on a substrate:
an anode which acts as a hole injection electrode;
a cathode which acts as an electron injection electrode;
a plurality of light emission layers each having a light emission region; and
a charge generation layer which injects electrons into a light emission layer arranged close to said anode and holes into a light emission layer arranged close to said cathode, and said light emission layers and said charge generation layer being arranged between said anode and said cathode;
wherein the electron affinity of said charge generation layer is configured lower than the electron affinity of the light emission layer arranged close to said anode, and
wherein the ionization potential of said charge generation layer is configured higher than the ionization potential of the light emission layer arranged close to said cathode.

13. An organic electroluminescence element comprising, on a substrate;
an anode which acts as a hole injection electrode;
a cathode which acts as an electron injection electrode;
a plurality of light emission layers each having a light emission region; and
a charge generation layer which injects electrons into a light emission layer arranged close to said anode and holes into a light emission layer arranged close to said cathode, and said light emission layers and said charge generation layer being arranged between said anode and said cathode, wherein the potential difference between the electron affinity of the light emission layer arranged close to said anode and the electron affinity of said charge generation layer, and the potential difference between the ionization potential of the light emission layer arranged close to said cathode and the ionization potential of said charge generation layer are both configured 0.6 eV or less.

14. An exposure unit which uses an organic electroluminescence element as a light source, said element comprising, on a substrate:
an anode which acts as a hole injection electrode;
a cathode which acts as an electron injection electrode;
a plurality of light emission layers each having a light emission region;
a charge generation layer which injects electrons into a light emission layer arranged close to said anode and holes into a light emission layer arranged close to said cathode, and said light emission layers and said charge generation layer being arranged between said anode and said cathode;
wherein the unit comprises a waveguide the end plane of which in the sub-scanning direction is configured as the light emerging plane, and the light which emits from said organic electroluminescence element, incident on said waveguide, and emerges from said light emerging plane as the exposure light;
wherein said waveguide comprises:
a core having a specified refractive index smaller than that of said light emission; and
a clad that is formed around the outer periphery of said core and has a refractive index smaller than that of said core.

15. An exposure unit which uses an organic electroluminescence element as a light source, said element comprising, on a substrate:
an anode which acts as a hole injection electrode;
a cathode which acts as an electron injection electrode;
a plurality of light emission layers each having a light emission region;
a charge generation layer which injects electrons into a light emission layer arranged close to said anode and holes into a light emission layer arranged close to said cathode, and said light emission layers and said charge generation layer being arranged between said anode and said cathode;
wherein the unit comprises a waveguide the end plane of which in the sub-scanning direction is configured as the light emerging plane, and the light which emits from said organic electroluminescence element, incident on said waveguide, and emerges from said light emerging plane as the exposure light;
wherein said waveguide comprises:
a core having a specified refractive index larger than the value obtained by subtracting 0.3 from the refractive index of said light emission layer; and
a clad that is formed around the outer periphery of said core and has a refractive index smaller than that of said core.

16. An exposure unit which uses an organic electroluminescence element as a light source, said element comprising, on a substrate:
an anode which acts as a hole injection electrode;
a cathode which acts as an electron injection electrode;
a plurality of light emission layers each having a light emission region;
a charge generation layer which injects electrons into a light emission layer arranged close to said anode and holes into a light emission layer arranged close to said cathode, and said light emission layers and said charge generation layer being arranged between said anode and said cathode;
wherein the unit comprises a waveguide the end plane of which in the sub-scanning direction is configured as the light emerging plane, and the light which emits from said organic electroluminescence element, incident on said waveguide, and emerges from said light emerging plane as the exposure light;
wherein, in said waveguide, an angle conversion unit is formed at the interface between said core and clad located at the opposite side of said light emission layer that converts the angle of the light impinging on said waveguide from said light emission layer to guide to said light emerging plane.

17. An exposure unit which uses an organic electroluminescence element as a light source, said element comprising, on a substrate:
an anode which acts as a hole injection electrode;
a cathode which acts as an electron injection electrode;
a plurality of light emission layers each having a light emission region;
a charge generation layer which injects electrons into a light emission layer arranged close to said anode and holes into a light emission layer arranged close to said cathode, and said light emission layers and said charge generation layer being arranged between said anode and said cathode;
wherein the organic electroluminescence element is applied a negative voltage between said anode and said cathode during the period of no light emission.

18. An organic electroluminescence element comprising, on a substrate;
   an anode which acts as a hole injection electrode;
   a cathode which acts as an electron injection electrode;
   a plurality of light emission layers each having a light emission region; and
   a charge generation layer which injects electrons into a light emission layer arranged close to said anode and holes into a light emission layer arranged close to said cathode, and said light emission layers and said charge generation layer being arranged between said anode and said cathode, wherein the potential difference between the ionization potential of the light emission layer arranged close to said cathode and the ionization potential of said charge generation layer is configured 0.6 eV or less.

19. An organic electroluminescence element comprising, on a substrate;
   an anode which acts as a hole injection electrode;
   a cathode which acts as an electron injection electrode;
   a plurality of light emission layers each having a light emission region; and
   a charge generation layer which injects electrons into a light emission layer arranged close to said anode and holes into a light emission layer arranged close to said cathode, and said light emission layers and said charge generation layer being arranged between said anode and said cathode, wherein the potential difference between the electron affinity of the light emission layer arranged close to said anode and the electron affinity of said charge generation layer is configured 0.6 eV or less.

* * * * *

UNITED STATES PATENT AND TRADEMARK OFFICE
CERTIFICATE OF CORRECTION

| | | |
|---|---|---|
| PATENT NO. | : 7,158,161 B2 | Page 1 of 1 |
| APPLICATION NO. | : 10/665011 | |
| DATED | : January 2, 2007 | |
| INVENTOR(S) | : Gyoutoku et al. | |

It is certified that error appears in the above-identified patent and that said Letters Patent is hereby corrected as shown below:

At column 37, line 61 (claim 14 line 22), "light emission;" should be --light emission layers;--

Signed and Sealed this

First Day of April, 2008

JON W. DUDAS
*Director of the United States Patent and Trademark Office*